(12) United States Patent
Tamura et al.

(10) Patent No.: US 9,897,934 B2
(45) Date of Patent: Feb. 20, 2018

(54) TONER

(71) Applicant: CANON KABUSHIKI KAISHA, Tokyo (JP)

(72) Inventors: Junichi Tamura, Toride (JP); Hayato Ida, Toride (JP); Takaho Shibata, Tokyo (JP); Yuya Chimoto, Funabashi (JP); Ryuji Murayama, Nagareyama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/532,543

(22) PCT Filed: Dec. 8, 2015

(86) PCT No.: PCT/JP2015/084871
§ 371 (c)(1),
(2) Date: Jun. 2, 2017

(87) PCT Pub. No.: WO2016/093367
PCT Pub. Date: Jun. 16, 2016

(65) Prior Publication Data
US 2017/0363982 A1 Dec. 21, 2017

(30) Foreign Application Priority Data
Dec. 9, 2014 (JP) ................. 2014-249318

(51) Int. Cl.
*G03G 9/08* (2006.01)
*G03G 9/087* (2006.01)
(Continued)

(52) U.S. Cl.
CPC ....... *G03G 9/08755* (2013.01); *G03G 9/0819* (2013.01); *G03G 9/0821* (2013.01);
(Continued)

(58) Field of Classification Search
CPC .......... G03G 9/08755; G03G 9/08797; G03G 9/0819; G03G 9/0821; G03G 9/0825; G03G 9/0827
(Continued)

(56) References Cited

U.S. PATENT DOCUMENTS 3,853,778 A 12/1974 Buckley et al.
7,833,687 B2 11/2010 Kato et al.
(Continued)

FOREIGN PATENT DOCUMENTS

JP 56-13943 B2 4/1981
JP 62-39428 2/1987
(Continued)

OTHER PUBLICATIONS

U.S. Appl. No. 15/527,191, Takaho Shibata, filed May 16, 2017.

*Primary Examiner* — Mark A Chapman
(74) *Attorney, Agent, or Firm* — Fitzpatrick Cella Harper and Scinto

(57) ABSTRACT

Provided is a toner that achieves low-temperature fixability, storability and charging performance all at a high level, in which a toner containing a crystalline resin and an amorphous resin, wherein a standard deviation of hydrogen nuclear relaxation times (HT1$\rho$-C) of the toner as measured by solid-state $^{13}$C-NMR is from 0.0 to 5.0, and a hydrogen nuclear relaxation time (HT1$\rho$-C1) of a $^{13}$C peak with the longest relaxation time out of the hydrogen nuclear relaxation times (HT1$\rho$-C) and a hydrogen nuclear relaxation time (HT1$\rho$-A1) of a $^{13}$C peak with the shortest relaxation time out of the hydrogen nuclear relaxation times (HT1$\rho$-A) satisfy $3.0 \leq \{(HT1\rho\text{-}C1)/(HT1\rho\text{-}A1)\} \leq 6.0$.

20 Claims, 2 Drawing Sheets

(51) Int. Cl.
    *G01R 33/46*     (2006.01)
    *C08L 67/02*     (2006.01)

(52) U.S. Cl.
    CPC ......... *G03G 9/0825* (2013.01); *G03G 9/0827* (2013.01); *G03G 9/08797* (2013.01); *C08L 67/025* (2013.01); *G01R 33/46* (2013.01)

(58) Field of Classification Search
    USPC ................................ 430/109.4, 110.1, 111.4
    See application file for complete search history.

(56) References Cited

U.S. PATENT DOCUMENTS

| | | |
|---|---|---|
| 8,697,327 B2 | 4/2014 | Shibata et al. |
| 9,057,970 B2 | 6/2015 | Ida et al. |
| 9,348,247 B2 | 5/2016 | Ida et al. |
| 9,540,483 B2 | 1/2017 | Ida et al. |
| 9,696,644 B2 | 7/2017 | Ida et al. |
| 2013/0108955 A1 | 5/2013 | Shibata et al. |
| 2015/0099227 A1 | 4/2015 | Ida et al. |

FOREIGN PATENT DOCUMENTS

| | | |
|---|---|---|
| JP | 04120554 A | 4/1992 |
| JP | 1160739 A | 3/1999 |
| JP | 200029240 A | 1/2000 |
| JP | 2013130633 A | 7/2013 |
| JP | 2014153416 A | 8/2014 |
| WO | 2014184979 A1 | 11/2014 |

TONER

This application is a national phase of PCT Application No. PCT/JP2015/084871 filed Dec. 8, 2015, which in turn claims benefit of Japanese Patent Application No. 2014-249318 filed Dec. 9, 2014.

TECHNICAL FIELD

The present invention relates to a toner to be used for developing electrostatic images in electrophotograpic methods, electrostatic recording methods and the like.

BACKGROUND ART

In response to recent demands for energy savings in image formation, efforts are being made to reduce toner fixation temperatures. One proposal has been to reduce fixation temperatures still further by using a polyester with a low softening temperature. Because the softening temperature is low, however, the toner particles may fuse together and blocking may occur when the toner is left standing during storage or transportation.

As a means of achieving both blocking resistance and low-temperature fixability, a technique has been proposed using a crystalline resin with a sharp melt property, meaning that its viscosity decreases sharply when its melting temperature is exceeded (Patent Literatures 1 to 3).

CITATION LIST

Patent Literature

[PTL 1] Japanese Examined Patent Publication No. S56-13943
[PTL 2] Japanese Examined Patent Publication No. S62-39428
[PTL 3] Japanese Patent Application Publication No. H4-120554

SUMMARY OF INVENTION

Technical Problem

When a crystalline resin is used alone as a toner, a serious problem has been that the toner charge gradually escapes after triboelectric charging due to the low electrical resistance of the crystalline resin.

On the other hand, sometimes a crystalline resin and an amorphous resin are combined as toner materials. In this case, the crystalline resin and the amorphous resin must be highly compatible in order to obtain low-temperature fixability. However, the problem has been that when the two resins are highly compatible, the crystalline resin and the amorphous resin become compatibilized during toner manufacture, lowering the glass transition temperature (hereinafter also simply called "Tg") of the toner and thereby detracting from the charging performance and storability (blocking resistance for example) of the toner.

When poorly compatible resins are selected as the crystalline resin and the amorphous resin in order to secure charging performance and blocking resistance, on the other hand, the problem has been that while charging performance and blocking resistance are obtained, the plasticization effect of the crystalline resin on the amorphous resin is hard to achieve, and low-temperature fixability is hard to obtain.

Solution to Problem

The inventors discovered as a result of exhaustive research that when conditions (1) and (2) below are met, a toner is obtained that provides low-temperature fixability, storability and charging performance all at a high level.

(1) In measurement of the toner by solid-state $^{13}$C-NMR, there is little variation in the hydrogen nuclear relaxation times (HT1ρ-C) of the respective constituent components of the crystalline resin in the toner.

(2) The ratio of the hydrogen nuclear relaxation time (HT1ρ-C1) of the constituent component with the longest relaxation time out of the hydrogen nuclear relaxation times (HT1ρ-C) of the respective constituent components of the crystalline resin to the hydrogen nuclear relaxation time (HT1ρ-A1) of the constituent component with the shortest relaxation time out of the hydrogen nuclear relaxation times (HT1ρ-A) of the respective constituent components of the amorphous resin {(HT1ρ-C1)/(HT1ρ-A1)} is within a specific range.

That is, the present invention is a toner containing a crystalline resin and an amorphous resin, wherein a standard deviation of hydrogen nuclear relaxation times (HT1ρ-C) of the toner as measured by solid-state $^{13}$C-NMR is at least 0.0 and not more than 5.0, and a hydrogen nuclear relaxation time (HT1ρ-C1) of a $^{13}$C peak with the longest relaxation time out of the hydrogen nuclear relaxation times (HT1ρ-C) and a hydrogen nuclear relaxation time (HT1ρ-A1) of a $^{13}$C peak with the shortest relaxation time out of hydrogen nuclear relaxation times (HT1ρ-A) satisfy the following Formula (1).

$$3.0 \le \{(HT1\rho\text{-}C1)/(HT1\rho\text{-}A1)\} \le 6.0 \quad \text{(Formula 1)}$$

The hydrogen nuclear relaxation times (HT1ρ-C) are obtained by solid-state $^{13}$C-NMR (CP/MAS) measurement of $^{13}$C peaks derived from the crystalline resin.

The $^{13}$C peaks derived from the crystalline resin are obtained by;

measuring the toner using solid-state $^{13}$C-NMR (DD/MAS), arranging peak intensity of $^{13}$C peaks derived from the crystalline resin in descending order, selecting $^{13}$C peaks starting with the $^{13}$C peak with the highest peak intensity and ending with the $^{13}$C peak at which the ratio of a cumulative value of the integral intensity of the $^{13}$C peak to a total value of the integral intensities of all $^{13}$C peaks reaches 90%.

while the hydrogen nuclear relaxation times (HT1ρ-A) are obtained by solid-state $^{13}$C-NMR (CP/MAS) measurement of all of $^{13}$C peaks derived from the amorphous resin.

The $^{13}$C peaks derived from the amorphous resin are obtained by measuring the toner using solid-state $^{13}$C-NMR (DD/MAS).

The fact that there is little variation in HT1ρ-C(that is, the standard deviation of HT1ρ-C is at least 0.0 and not more than 5.0) and that {(HT1ρ-C1)/(HT1ρ-A1)} is within a specific range indicates that the crystalline resin is dispersed uniformly as minute domains several nanometers in size in a matrix of the amorphous resin, and that the crystalline resin and the amorphous resin are thoroughly phase separated.

Contact between domains of the low-resistance crystalline resin can be prevented by uniformly dispersing the crystalline resin as minute domains several nanometers in size in a matrix of the amorphous resin. This prevents charge escape routes from forming in the matrix of the high-resistance amorphous resin, and allows the toner to have high charging performance.

Because the crystalline resin domains are minute, moreover, the area of contact with the amorphous resin matrix can be larger, dramatically improving the efficiency of plasticization of the amorphous resin by the crystalline resin, and allowing the toner to have excellent low-temperature fixability.

Because the crystalline resin and the amorphous resin are thoroughly phase separated, moreover, the Tg of the amorphous resin matrix can be prevented from falling, yielding a toner with excellent storability.

Advantageous Effects of Invention

The present invention can provide a toner that achieves a high level of low-temperature fixability, storability and charging performance.

Further features of the present invention will become apparent from the following description of exemplary embodiments.

DESCRIPTION OF EMBODIMENTS

Figure 1:
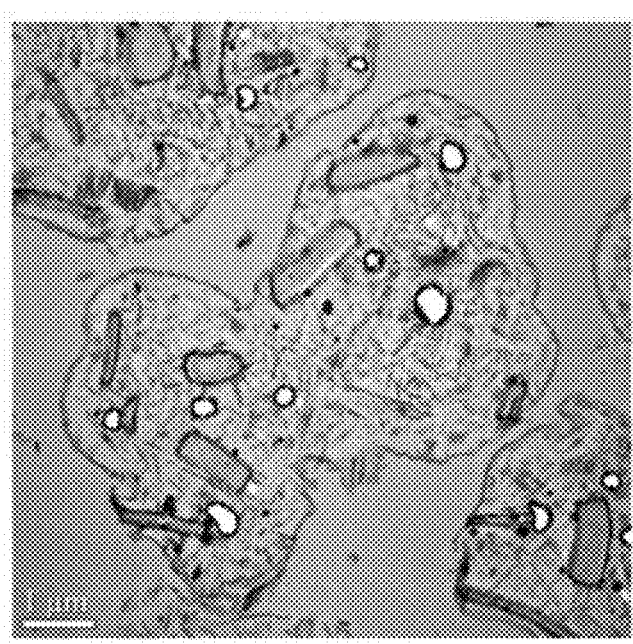
FIG. 1 is a transmission electron microscopic photograph of a toner cross-section of the present invention (photograph in lieu of drawing).

The toner of the present invention is a toner containing a crystalline resin and an amorphous resin, wherein a standard deviation of hydrogen nuclear relaxation times (HT1ρ-C) of the toner as measured by solid-state $^{13}$C-NMR is at least 0.0 and not more than 5.0, and a hydrogen nuclear relaxation time (HT1ρ-C1) of a $^{13}$C peak with the longest relaxation time out of the hydrogen nuclear relaxation times (HT1ρ-C) and a hydrogen nuclear relaxation time (HT1ρ-A1) of a $^{13}$C peak with the shortest relaxation time out of hydrogen nuclear relaxation times (HT1ρ-A) satisfy the following Formula (1):

$$3.0 \leq \{(HT1\rho\text{-}C1)/(HT1\rho\text{-}A1)\} \leq 6.0 \quad \text{(Formula 1)}$$

the hydrogen nuclear relaxation times (HT1ρ-C) being obtained by solid-state $^{13}$C-NMR (CP/MAS) measurement of $^{13}$C peaks derived from the crystalline resin, the $^{13}$C peaks derived from the crystalline resin being obtained by;

measuring the toner using solid-state $^{13}$C-NMR (DD/MAS), arranging peak intensity of $^{13}$C peaks derived from the crystalline resin in descending order, selecting $^{13}$C peaks starting with the $^{13}$C peak with the highest peak intensity and ending with the $^{13}$C peak at which the ratio of the cumulative value of the integral intensity of the $^{13}$C peak to the total value of the integral intensities of all $^{13}$C peaks reaches 90%, while the hydrogen nuclear relaxation times (HT1ρ-A) being obtained by solid-state $^{13}$C-NMR (CP/MAS) measurement of all of $^{13}$C peaks derived from the amorphous resin, the $^{13}$C peaks derived from the amorphous resin being obtained by measuring the toner using solid-state 13C-NMR (DD/MAS).

Solid-state $^{13}$C-NMR of the toner is explained below.
<Solid-State $^{13}$C-NMR Measurement Conditions>
Unit: CMX-300 Infinity (Chemagnetics, Inc.)
Measurement methods: DD/MAS, CP/MAS, relaxation time measurement (single component analysis)
Measurement frequency: 75.188829 MHz ($^{13}$C nucleus)
Spectrum width: 30.003 kHz
Pulse width: 4.2 μsec (900 pulse)
Pulse recurrence period: ACQTM: 34.13 msec
PD: 8.0 sec (CP/MAS, relaxation time measurement), 600 sec (DD/MAS)
Contact time: 3.0 msec
Observation points: 1024, data points: 8192
Standard substance: Polydimethylsiloxane (internal standard: 1.56 ppm)
Temperature: room temperature (about 22° C.)
Sample rotational speed: 10.3 kHz 50 mg to 100 mg of toner is densely packed in a sample tube to prepare a measurement sample, which is then measured under the following conditions.

The standard deviation of the hydrogen nuclear relaxation times (HT1ρ-C) derived from the crystalline resin is calculated as follows.

(1) The toner is measured by solid-state $^{13}$C-NMR (DD/MAS) under the aforementioned conditions.

(2) The $^{13}$C peaks derived from the crystalline resin are identified out of the $^{13}$C peaks obtained by measurement.

(3) The identified $^{13}$C peaks are arranged in descending order of peak intensity (P1 (highest), P2 . . . Pn (lowest)).

(4) The individual integral intensities of P1 through Pn are determined (peak area; P1a, P2a . . . Pna).

(5) The total value of the integral intensities of all $^{13}$C peaks derived from the crystalline resin (P1a+ . . . +Pna) is determined.

(6) Pαa (α<n) is determined when {cumulative value (P1a+ . . . +Pαa)}/{total value (P1a+ . . . +Pna)}×100 is 90 or more.

(7) The hydrogen nuclear relaxation times (HT1ρ-C) of the individual $^{13}$C peaks P1, P2 . . . Pα are measured by solid-state $^{13}$C-NMR (CP/MAS).

(8) The standard deviation of the resulting hydrogen nuclear relaxation times (HT1ρ-C) is calculated.

Hydrogen nuclear relaxation time (HT1ρ) is an indicator of the mobility of the respective functional groups of measured resin. A high HT1ρ means high mobility, and a low HT1ρ means low mobility.

In general, crystalline resins used in toners have high HT1ρ-C values by themselves, while amorphous resins exhibit low HT1ρ-A values.

The HT1ρ values of a composite material such as the toner of the invention consisting of at least two kinds of resins (that is, a crystalline resin and an amorphous resin) affect each other in a way that is dependent on the physical distance between the resins.

When a crystalline resin is uniformly dispersed as minute domains several nanometers in size in a matrix of an amorphous resin, the amorphous resin tends to affect the functional groups of the crystalline resin near the boundary with the amorphous resin to the same degree as it affects the functional groups of the crystalline resin near the centers of the domains, and there is little variation in HT1ρ-C values.

However, when a crystalline resin is phase separated as domains larger than several nanometers in size in a matrix of an amorphous resin, the degree of effect of the amorphous resin on the functional groups of the crystalline resin near the boundary with the amorphous resin is quite different from the degree of effect on the functional groups of the crystalline resin near the centers of the domains.

Specifically, the functional groups of the crystalline resin near the boundary with the amorphous resin are affected by the amorphous resin and lose mobility, lowering the HT1ρ-C values. Meanwhile, the functional groups of the crystalline resin located near the centers of the domains are less affected by the amorphous resin, so their mobility is not reduced, and the HT1ρ-C values remain high. This produces greater variation in HT1ρ-C values. In conventional toners, there is large variation in HT1ρ-C values because the crystalline resin is phase separated as domains larger than several nanometers in size.

As discussed above, the $^{13}C$ peaks derived from the crystalline resin in the toner can be identified by solid-state $^{13}C$-NMR (DD/MAS) measurement, and relaxation of components with slow relaxation can be completed by having a long waiting time of 600 seconds. The resulting data are thus quantitative, and it is possible to measure accurately from the $^{13}C$ peak with the highest peak intensity out of the $^{13}C$ peaks derived from the crystalline resin to the $^{13}C$ peak at which the ratio of the cumulative value of the integral intensity of that $^{13}C$ peak to the total value of the integral intensities of all $^{13}C$ peaks reaches 90%.

By evaluating the relaxation times up to the $^{13}C$ peak at which the ratio of the cumulative value of the integral intensity of that $^{13}C$ peak reaches 90%, it is possible to exclude the effects of impurities, and to evaluate the relaxation times of the necessary $^{13}C$ peaks derived from the crystalline resin.

When the standard deviation of the hydrogen nuclear relaxation times (HT1ρ-C) is at least 0.0 and not more than 5.0, this means that the crystalline resin is uniformly dispersed as minute domains several nanometers in size in a matrix of the amorphous resin in the toner as discussed above. This prevents charge escape routes from forming in the matrix of the high-resistance amorphous resin, allowing the toner to have high charge performances Because the domains of the crystalline resin are minute, moreover, contact with the matrix of amorphous resin can be larger, dramatically improving the efficiency of plasticization of the amorphous resin by the crystalline resin, and allowing the toner to have excellent low-temperature fixability.

The standard deviation of the hydrogen nuclear relaxation times (HT1ρ-C) is more preferably at least 0.0 and not more than 4.5, or still more preferably at least 0.0 and not more than 4.0.

When {(HT1ρ-C1)/(HT1ρ-A1)} is at least 3.0 and not more than 6.0, moreover, this indicates that the crystalline resins are not in a compatibilized state, but are instead thoroughly phase separated in the toner. This makes it possible to prevent a drop in the Tg of the amorphous resin matrix, and obtain a toner with excellent storability.

When {(HT1ρ-C1)/(HT1ρ-A1)} is less than 3.0, the crystalline resin and the amorphous resin are not sufficiently phase separated, resulting in a drop in the Tg of the amorphous resin matrix, reducing the resistance of the amorphous resin matrix, and detracting from storability and charging performance.

When {(HT1ρ-C1)/(HT1ρ-A1)} exceeds 6.0, on the other hand, this means that the domains of the crystalline resin have become larger during phase separation, or else that some hardly compatible components have longer relaxation times, reducing the area of contact with the amorphous resin matrix, and causing charge escape routes to form in the amorphous resin matrix, detracting from low-temperature fixability and charging performance.

{(HT1ρ-C1)/(HT1ρ-A1)} is more preferably at least 3.0 and not more than 5.0, or still more preferably at least 3.0 and not more than 4.5.

The {(HT1ρ-C1)/(HT1ρ-A1)} and the standard deviation of the hydrogen nuclear relaxation times (HT1ρ-C) of the toner can be controlled within the aforementioned range by uniformly dispersing the crystalline resin in the amorphous resin matrix as minute domains several nanometers in size, and by thoroughly phase separating the crystalline resin and the amorphous resin.

In this invention, the standard deviation of hydrogen nuclear relaxation times (HT1ρ-C) of a toner imparted with heat history as measured by solid-state $^{13}C$-NMR is preferably at least 8.0 and not more than 12.0.

The toner imparted with heat history is obtained by heating and melting the toner at a temperature 50° C. higher than the glass transition temperature of the toner, and then cooling the toner to 25° C. at a rate of 20° C./minute, and a hydrogen nuclear relaxation time (HT1ρ-C2) [the unit is millisecond and is also simply called msec hereinafter] of a $^{13}C$ peak with the shortest relaxation time out of the hydrogen nuclear relaxation times (HT1ρ-C) and a hydrogen nuclear relaxation time (HT1ρ-A2) of a $^{13}C$ peak with the longest relaxation time out of the hydrogen nuclear relaxation times (HT1ρ-A) [msec] preferably satisfy the following Formula (2):

$$-2.0 \text{ msec} \leq \{(HT1\rho\text{-}C2)-(HT1\rho\text{-}A2)\} \leq 10.0 \text{ msec.} \quad \text{(Formula 2)}$$

The hydrogen nuclear relaxation times (HT1ρ-C) are obtained by solid-state $^{13}C$-NMR (CP/MAS) measurement of $^{13}C$ peaks derived from the crystalline resin.

The $^{13}C$ peaks derived from the crystalline resin are obtained by;

measuring the toner imparted with heat history using solid-state $^{13}C$-NMR (DD/MAS), arranging peak intensity of $^{13}C$ peaks derived from the crystalline resin in descending order, selecting $^{13}C$ peaks starting with the $^{13}C$ peak with the highest peak intensity and ending with the $^{13}C$ peak at which the ratio of the cumulative value of the integral intensity of that $^{13}C$ peak to the total value of the integral intensities of all $^{13}C$ peaks reaches 90%.

while the hydrogen nuclear relaxation times (HT1ρ-A) are obtained by solid-state $^{13}C$-NMR (CP/MAS) measurement of all of $^{13}C$ peaks derived from the amorphous resin.

The $^{13}C$ peaks derived from the amorphous resin are obtained by measuring the toner imparted with heat history using solid-state $^{13}C$-NMR (DD/MAS).

For the toner to fulfill these conditions indicates that the compatibility between the crystalline resin and the amorphous resin is within the optimal range, and the properties of low-temperature fixability, storability and charging performance are further improved.

When the compatibility between the crystalline resin and the amorphous resin making up the toner is within the optimal range, part of the crystalline resin and amorphous resin is compatibilized while another part is phase separated in a toner imparted with heat history obtain by heating and melting a toner and then cooling the toner rapidly as described above. As a result, the HT1ρ-C has a large standard deviation of 8.0 or more.

Moreover, because part of the crystalline resin and amorphous resin is compatibilized while another part is phase separated in the toner imparted with heat history, the values of (HT1ρ-C2) and (HT1ρ-A2) are close, and {(HT1ρ-C2)–(HT1ρ-A2)} exhibits a range from –2.0 msec to 10.0 msec.

The charging performance and storability of the toner tend to be less when the standard deviation of the HT1ρ-C values of the toner imparted with heat history is less than 8.0, and {(HT1ρ-C2)–(HT1ρ-A2)} is from –2.0 msec to 10.0 msec.

On the other hand, when the standard deviation of the HT1ρ-C values of the toner imparted with heat history is less than 8.0 and {(HT1ρ-C2)–(HT1ρ-A2)} is greater than 10.0 msec, or when the standard deviation of the HT1ρ-C values of the toner imparted with heat history is 8.0 or greater and {(HT1ρ-C2)–(HT1ρ-A2)} is also greater than 10.0 msec, the low-temperature fixability of the toner tends to be less.

The standard deviation of the HT1ρ-C of the toner imparted with heat history is more preferably at least 8.0 and not more than 10.0. Also, the {(HT1ρ-C2)–(HT1ρ-A2)} of the toner imparted with heat history is more preferably at least –2.0 msec and not more than 8.0 msec.

In this invention, the toner imparted with heat history is prepared by the following procedure.

Using a biaxial kneading extruder (PCM-30, Ikegai Kogyo) set to a rotational speed of 200 rpm and a temperature 50° C. higher than the glass transition temperature of the toner, the toner was heated and melted for 1 hour and then cooled to 25° C. at a rate of 20° C./minute to produce a treated product.

The resulting treated product was coarsely pulverized in a cutter mill, and then finely pulverized in a turbo mill to obtain a toner imparted with heat history.

Next, the constituent materials of the toner of this invention are explained.

<Crystalline Resin>

In this invention, the crystalline resin is not particularly limited as long as it has crystallinity and can fulfill the conditions for hydrogen nuclear relaxation time, and may be selected appropriately according to the object.

The crystalline resin exhibits a melting endothermic peak (melting point) in differential scanning calorimetric measurement using a differential scanning calorimeter (DSC).

Resins that can be used include, for example, crystalline polyester resins, crystalline polyurethane resins, crystalline polyurea resins, crystalline polyamide resins, crystalline polyether resins, crystalline vinyl resins and modified forms of these. One of these alone or a combination of two or more may be used. Of these, a crystalline polyester resin is preferred from the standpoint of melting point and mechanical strength.

The crystalline polyester resin is not particularly limited, but examples include those obtained by condensation polymerization of a diol component and a dicarboxylic acid component.

The following are specific examples of the diol component: ethylene glycol, 1,3-propanediol, 1,4-butanedibl, 1,5-pentanediol, 1,6-hexanediol, 1,7-heptanediol, 1,8-octanediol, 1,9-nonanediol, 1,10-decanediol, 1,11-undecanediol, 1,12-dodecanediol, 1,13-tridecanediol, 1,14-tetradecanediol, 1,18-octadecanediol, 1,20-icosanediol, 2-methyl-1,3-propanediol, cyclohexanediol, cyclohexanedimethanol and derivatives of these. The derivatives are not particularly limited as long they yield similar resin structures by the aforementioned condensation polymerization. Examples include esterified derivatives of the aforementioned diols.

Of these, a $C_{4-12}$ linear aliphatic diol is preferred from the standpoint of ester group concentration and melting point.

A trivalent or higher alcohol such as glycerin, penterythritol, hexamethylol melamine or hexaethylol melamine may also be used.

The following are specific examples of the dicarboxylic acid component: oxalic acid, malonic acid, maleic acid, fumaric acid, citraconic acid, itaconic acid, glutaconic acid, succinic acid, glutaric acid, adipic acid, pimelic acid, suberic acid, azelaic acid, sebacic acid, 1,9-nonanedicarboxylic acid, 1,10-decanedicarboxylic acid, 1,11-undecanedicarboxylic acid, 1,12-dodecanedicarboxylic acid, 1,13-tridecanedicarboxylic acid, 1,14-tetradecanedicarboxylic acid, 1,16-hexadecanedicarboxylic acid, 1,18-octadecanedicarboxylic acid; 1,1-cyclopentenedicarboxylic acid, 1,4-cyclohexanedicarboxylic acid, 1,3-cyclohexanedicarboxylic acid, 1,3-adamantanedicarboxylic acid and other alicyclic dicarboxylic acids; phthalic acid, isophthalic acid, terephthalic acid, p-phenylenediacetic acid, m-phenylenediacetic acid, p-phenylenedipropionic acid, m-phenylenedipropionic acid, naphthalene-1, 4-dicarboxylic acid, naphthalene-1,5-dicarboxylic acid and other aromatic dicarboxylic acids; and derivatives of these. The derivatives are not particularly limit as long as they yield similar resin structures by the aforementioned condensation polymerization. Examples include methyl esterified, ethyl esterified, and acid chloride derivatives of the listed dicarboxylic acids.

Of these, a $C_{6-14}$ linear aliphatic dicarboxylic acid is preferred from the standpoint of ester group concentration and melting point.

A trivalent or higher polyvalent carboxylic acid such as trimellitic acid, pyromellitic acid, naphthalenetricarboxylic acid, naphthalenetetracarboxylic acid, pyrenetricarboxylic acid or pyrenetetracarboxylic acid may also be used.

Preferred examples of crystalline polyester resins include resins obtained by condensation polymerization of diol components containing compounds selected from the group consisting of $C_{4-12}$ linear aliphatic diols and derivatives thereof with dicarboxylic acid components containing compounds selected from the group consisting of $C_{6-14}$ linear aliphatic dicarboxylic acids and derivatives thereof.

The total amount of this resin in the crystalline resin is preferably 60 mass % or more, or more preferably 90 mass % or more.

In general crystalline resins are known to have low volume resistance in comparison with amorphous resins. The inventors believe that the reasons for this are as follows.

Crystalline resins in general form crystal structures exhibiting regular arrangements of molecular chains, and from a macro perspective, appear to maintain a state of restricted molecular movement at temperatures below the melting point. However, crystalline resins are not composed entirely of crystalline structures on a micro scale, and instead form amorphous structural parts in addition to crystalline structural parts having crystalline structures exhibiting regular arrangements of molecular chains.

In the case of a crystalline polyester resin having a melting point within the range normally used for toner, because the glass transition temperature (Tg) of the crystalline polyester resin is much lower than room temperature, it is thought that the amorphous structural parts undergo molecular movement on a micro scale even at room temperature. It is thought that in such environments with high molecular mobility of the resin, charge acceptance is possible via ester bonds that are polar groups and the like, and that the volume resistance of the resin is reduced as a result.

Consequently, a crystalline polyester resin with a low ester group concentration is preferred because it may allow volume resistance to be increased by limiting the concentration of ester groups that are polar groups to a low level.

The value of the ester group concentration is determined primarily by the types of the diol component and the dicarboxylic acid component, and a low value can be achieved by selecting those with large numbers of carbon atoms However, a low ester group concentration may reduce compatibility with the amorphous resin, or raise the melting point of the resulting crystalline polyester resin.

The weight-average molecular weight (Mw) of the crystalline resin in this invention as measured by gel permeation chromatography is preferably from 5000 to 50000, or more preferably from 5000 to 20000.

The strength and low-temperature fixability of the resin in the toner can be further improved by keeping the weight-average molecular weight (Mw) of the crystalline resin within this range.

The weight-average molecular weight (Mw) of the crystalline resin can be easily controlled by controlling various known manufacturing conditions for the crystalline resin.

The weight-average molecular weight (Mw) of the crystalline resin can be measured as follows by gel permeation chromatography (GPC).

Special grade 2,6-di-t-butyl-4-methylphenol (BHT) is added to a concentration of 0.10 mass % to o-dichlorobenzene for gel chromatography, and dissolved at room temperature. The crystalline resin and the o-dichlorobenzene with the added BHT are placed in a sample bottle, and heated on a hot plate set to 150° C. to dissolve the crystalline resin.

Once the crystalline resin has dissolved, this is placed in a pre-heated filter unit, and set on the apparatus. The sample that passes through the filter unit is used as the GPC sample.

The sample solution is adjusted to a concentration of about 0.15 mass %.

Measurement is performed under the following conditions using this sample solution.

Apparatus: HLC-8121GPC/HT (TOSOH CORPORATION)
Detector: High-temperature RI
Column: TSKgel GMHHR-H HT, series of 2 (TOSOH CORPORATION)
Temperature: 135.0° C.
Solvent: o-dichlorobenzene for gel chromatography (0.10 mass % BHT added)
Flow rate: 1.0 ml/min.
Injected amount: 0.4 ml A molecular weight calibration curve prepared using standard polystyrene resins (TOSOH CORPORATION, trademark TSK Standard Polystyrene F-850, F-450, F-288, F-128, F-80, F-40, F-20, F-10, F-4, F-2, F-1, A-5000, A-2500, A-1000, A-500) is used for calculating the molecular weight of the crystalline resin.

In this invention, the melting point of the crystalline resin is preferably at least 50° C. and not more than 100° C. from the standpoint of low-temperature fixability and storability. Low-temperature fixability is further improved with a melting point of 100° C. or less, and still further improved with a melting point of 90° C. or less. On the other hand, storability tends to be reduced when the melting point is less than 50° C.

The melting point of the crystalline resin can be measured with a differential scanning calorimeter (DSC).

Specifically, from 0.01 to 0.02 g of sample is accurately weighed into an aluminum pan, the temperature is raised from 0° C. to 200° C. at a ramp rate of 10° C./min, and a DSC curve is obtained.

The peak temperature of the melting endothermic peak is given as the melting point based on the resulting DSC curve.

The melting point of the crystalline resin present in the toner can also be measured by similar methods. In this case, a melting point attributable to a release agent present in the toner may also be observed. The melting point of the release agent is distinguished from the melting point of the crystalline resin by extracting the release agent from the toner by Soxhlet extraction using a hexane solvent, performing differential scanning calorimetric measurement on the release agent alone by the same methods, and comparing the resulting melting point with the melting point of the toner.

In this invention, the toner preferably contains at least 10 mass % and not more than 40 mass % of the crystalline resin, and more preferably at least 20 mass % and not more than 30 mass % of the crystalline resin.

Better low-temperature fixability is obtained when the content of the crystalline resin is at least 10 mass %. Moreover, contact between domains of the low-resistance crystalline resin can be prevented more effectively when the content of the crystalline resin is 40 mass % or less. It is thus possible to dramatically prevent formation of charge escape routes in the matrix of the high-resistance amorphous resin, resulting in a toner with excellent charging performance.

<Amorphous Resin>

In this invention, the amorphous resin is not particularly limited as long as it is a resin without crystallinity, and a known polymer conventionally used in toners can be selected appropriately according to the object.

Specifically, the following polymers can be used: single polymers of styrene or substituted styrene such as polystyrene, poly-p-chlorstyrene, polyvinyltoluene; styrene-p-chlorstyrene copolymer, styrene-vinyltoluene copolymer, styrene-vinylnaphthaline copolymer, styrene-acrylate ester copolymer, styrene-methacrylate ester copolymer, styrene-methyl α-chloroacrylate copolymer, styrene-acrylonitrile copolymer, styrene-vinyl methyl ether copolymer, styrene-vinyl ethyl ether copolymer, styrene-vinyl methyl ketone copolymer, styrene-acrylonitrile-indene copolymer and other styrene copolymers; and polyvinyl chloride, phenolic resin, natural resin-modified phenolic resin, natural resin-modified maleic acid resin, acrylic resin, methacrylic resin, polyvinyl acetate, silicone resin, polyester resin, polyurethane resin, polyamide resin, furan resin, epoxy resin, xylene resin, polyvinyl butyral resin, terpene resin, coumarone-indene resin, petroleum resins and the like.

Examples using polyester resin as the amorphous resin are described in detail below, but the amorphous resin is not limited to polyester resin.

The amorphous polyester resin is not particularly limited, but may be obtained by condensation polymerization of an alcohol component and a carboxylic acid component.

The following are specific examples of the alcohol component: polyoxypropylene(2.2)-2,2-bis(4-hydroxyphenyl)propane, polyoxypropylene (3.3)-2,2-bis (4-hydroxyphenyl) propane, polyoxyethylene (2.0)-2,2-bis(4-hydroxyphenyl)propane, polyoxypropylene(2.0)-polyoxyethylene(2.0)-2,2-bis(4-hydroxyphenyl)propane, polyoxypropylene (6)-2,2-bis(4-hydroxyphenyl) propane and other bisphenol A alkylene oxide adducts; ethylene glycol, diethylene glycol, triethylene glycol, 1,2-propylene glycol, 1,3-propylene glycol, 1,4-butanediol, neopentyl glycol, 1,4-butenediol, 1,5-pentanediol, 1,6-hexanediol, 1,4-cyclohexanedimethanol, dipropylene glycol, polyethylene glycol, polypropylene glycol, polytetramethylene glycol, bisphenol A, hydrogenated bisphenol A, sorbitol, 1,2,3,6-hexanetetrole, 1,4-sorbitan, pentaerythritol, dipentaerythritol, tripentaerythritol, 1,2,4-butanetriol, 1,2,5-pentanetriol, glycerol, 2-methylpropanetriol, 2-methyl-1,2,4-butanetriol, trimethylol ethane, trimethylol propane, 1,3,5-trihydroxymethyl benzene and derivatives of theses. The derivatives are not particularly limited as long as they yield similar resin structures by the aforementioned condensation polymerization. Examples include esterified derivatives of the listed alcohol components.

Examples of the carboxylic acid component include the following: phthalic acid, isophthalic acid, terephthalic acid and other aromatic dicarboxylic acids or anhydrides thereof; succinic acid, adipic acid, sebacic acid, azelaic acid and other alkyldicarboxylic acids or ahydrides thereof; succinic acid and anhydrides of succinic acid substituted with $C_{6-18}$ alkyl or alkenyl groups; fumaric acid, maleic acid, citraconic acid and other unsaturated dicarboxylic acids or anhydrides thereof; trimellitic acid, pyromellitic acid, benzophenone tetracarboxylic acid and other polyvalent carboxylic acids and anhydrides thereof; and derivatives of these. The derivatives are not particularly limited as long as they yield similar resin structures by the aforementioned condensation polymerization. Examples include methyl esterified, ethyl esterified, and acid chloride derivatives of the listed dicarboxylic acid components.

Desirable examples of the amorphous polyester resin include resins obtained by condensation polymerization of an alcohol component containing a compound selected from the group consisting of the bisphenols represented by Structural Formula (1) below and derivatives thereof with a carboxylic acid component containing a compound selected from the group consisting of bivalent and higher carboxylic acids and derivatives thereof (for example, fumaric acid, maleic acid, anhydrous maleic acid, phthalic acid, terephthalic acid, trimellitic acid, pyromellitic acid, etc.).

[Chem. 1]

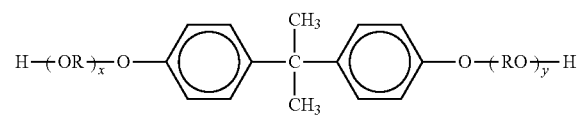

(1)

(wherein R represents an ethylene group or pyropyrene group, each of x and y is an integer of 1 or greater, and the average of x+y is from 2 to 10).

Other examples include resins obtained by condensation polymerization of alcohol components containing compounds selected from the group consisting of the bisphenols represented by Structural Formula (2) below and derivatives thereof with carboxylic acid components containing compounds selected from the group consisting of aromatic dicarboxylic acids and derivatives thereof (for example, isophthalic acid, terephthalic acid).

The total content of the compound selected from the group consisting of the bisphenols represented by Structural Formula (2) below and derivatives thereof is preferably 50 mol % or more of the alcohol component, or more preferably 90 mol % or more of the alcohol component.

Moreover, the total content of this resin as a percentage of the amorphous resin is preferably 25 mass % or more, or more preferably 50 mass % or more.

[Chem. 2]

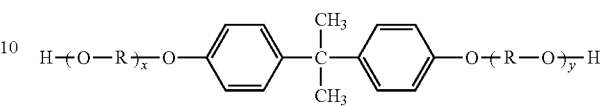

(2)

(wherein R is —$CH_2$—CH ($CH_3$)—, each of x and y is an integer of 1 or greater, and the average of x+y is from 2 to 10).

In this invention, the glass transition temperature of the amorphous resin is preferably from 30° C. to 80° C.

Storability is improved when the glass transition temperature is 30° C. or greater.

This also improves the charging performance by making it less likely that resistance will be reduced due to molecular movement of the resin in high-temperature, high-humidity environments.

On the other hand, low-temperature fixability is improved when the glass transition temperature is 80° C. or less.

A glass transition temperature of at least 40° C. is more preferred for improving the storability. Also, a glass transition temperature of 70° C. or less is more preferred for improving the low-temperature fixability.

The glass transition temperature (Tg) can be measured using a differential scanning calorimeter (Mettler Toledo International Inc. DSC822/EK90).

Specifically, from 0.01 to 0.02 g of sample is accurately weighed into an aluminum pan, and the temperature is raised from 0° C. to 200° C. at a ramp rate of 10° C./min. Next, the temperature is lowered from 200° C. to −100° C. at a rate of 10° C./min, and then raised again from −100° C. to 200° C. at a ramp rate of 10° C./min, and a DSC curve is obtained.

Based on the resulting DSC curve, the glass transition temperature is the temperature at the intersection on the resulting DSC curve a line extending the low-temperature base line to the high-temperature side and a line drawn at the point tangential to the slope of the curve at the portion of the curve where glass transition temperature changes in steps reaches a maximum.

In this invention, the softening temperature (Tm) of the amorphous resin is preferably from 700° C. to 150° C., or more preferably from 80° C. to 140° C., or still more preferably from 80° C. to 130° C.

With a softening temperature (Tm) within this temperature range, it is possible to achieve both good blocking resistance and good offset resistance, with an appropriate degree of penetration of the paper by the molten toner component during fixation at high temperatures, and good surface smoothness.

In this invention, the softening temperature (Tm) of the amorphous resin can be measured with a constant load extrusion-type capillary rheometer (flow characteristics evaluating device, CFT-500D flow tester, Shimadzu Corporation).

The CFT-500D is a device that exerts a constant load with a piston from above while heating and melting a measurement sample filled in a cylinder and extruding it through capillaries at the bottom of a cylinder, and can then graph a rheogram based on the descent (mm) of the piston and the temperature (° C.) during this process.

In this invention, the "melting temperature by the ½ method" as described in attached manual of the flow characteristics evaluating device, CFT-500D flow tester is defined as the softening temperature (Tm).

The melting temperature by the ½ method is calculated as follows.

½ of the difference between the descent of the piston when outflow is complete (outflow completion point, called Smax) and the descent of the piston at the beginning of outflow (lowest point, Smin) is determined and given as X (X=(Smax−Smin)/2). The temperature of the rheogram when the descent of the piston reaches the sum of X and Smin is then given as the melting temperature by the ½ method.

For the measurement sample, 1.2 g of amorphous resin is compression molded for 60 seconds at 10 MPa in an environment of 25° C. with a tablet molding compressor (for example, a standard manual Newton Press NT-100H, NPa SYSTEM CO., LTD) into a cylinder 8 mm in diameter.

The specific measurement operations are performed in accordance with the attached manual.

The CFT-500D measurement conditions are as follows
Test mode: Temperature raising method
Initiation temperature: 60° C.
Saturated temperature: 200° C.
Measurement interval: 1.0° C.
Ramp rate: 4.0° C./min.
Piston cross-section: 1.000 cm$^2$
Test load (piston load): 5.0 kgf
Pre-heating time: 300 seconds
Die hole diameter: 1.0 mm
Die length: 1.0 mm The amorphous resin preferably has ionic groups, namely carboxylic acid groups, sulfonic acid groups or amino groups, in the resin skeleton, and more preferably has carboxylic acid groups.

The acid value of the amorphous resin is preferably from 3 mg KOH/g to 35 mg KOH/g, or more preferably from 8 mg KOH/g to 25 mg KOH/g.

A good charge quantity can be obtained under both high-humidity and low-humidity environments when the acid value of the amorphous resin is within this range. The acid value is the number of milligrams of potassium hydroxide required to neutralize the free fatty acids, resin acids and the like contained in 1 g of sample, and is measured in accordance with JIS-K0070.

In this invention, the crystalline resin and the amorphous resin are preferably a compatible combination. The following are considered when selecting a compatible combination of crystalline resin and amorphous resin.

Select a crystalline resin and an amorphous resin with the same resin skeleton.

For example, use a crystalline polyester resin as the crystalline resin and an amorphous polyester resin as the amorphous resin, or else a crystalline acrylic resin as the crystalline resin and an amorphous acrylic resin as the amorphous resin.

Specific examples include, but are not limited to, the following examples.

The crystalline resin is a resin obtained by condensation polymerization of a dicarboxylic acid component containing at least one of compound selected from the group consisting of dicarboxylic acids represented by Structural Formula I below and derivatives thereof with a diol component containing at least one of compound selected from the group consisting of diols represented by Structural Formula II below and derivatives thereof.

The amorphous resin is a resin obtained by condensation polymerization of a dicarboxylic acid component containing at least one of compound selected from the group consisting of isophthalic acid, terephthalic acid and derivatives of these with a diol component in which at least one of compound selected from the group consisting of aromatic diols represented by Structural Formula III below and derivatives thereof constitutes at least 50 mol % to the total of the diol component.

[Chem. 3]

Structural Formula I

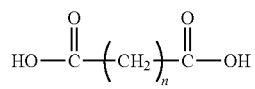

Structural Formula II

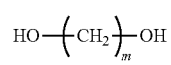

(each of n and m in Structural Formulae I and II is an integer of at least 4 and not more than 12)

Structural Formula III

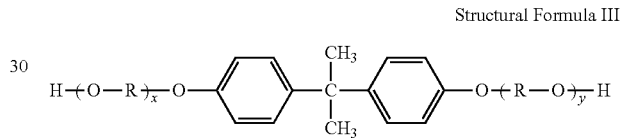

(R in Structural Formula III is —CH$_2$—CH(CH$_3$)'—, each of x and y is an integer of at least 1, and the average of x+y is at least 2 and not more than 10).

In this invention, the ratio of the crystalline resin to the amorphous resin by mass is preferably 5:95 to 50:50, or more preferably 10:90 to 40:60, or still more preferably 15:85 to 30:70.

<Colorant>

The toner of the invention may also contain a colorant. Examples of the colorant include known organic pigments, dyes, carbon black, magnetic powders and the like.

Examples of cyan colorants include copper phthalocyanine compounds and derivatives thereof, anthraquinone compounds and basic dye lake compounds. Specific examples include C.I. pigment blue 1, C.I. pigment blue 7, C.I. pigment blue 15, C.I. pigment blue 15:1, C.I. pigment blue 15:2, C.I. pigment blue 15:3, C.I. pigment blue 15:4, C.I. pigment blue 60, C.I. pigment blue 62 and C.I. pigment blue 66.

Examples of magenta colorants include condensed azo compounds, diketopyrrolopyrrole compounds, anthraquinone compounds, quinacridone compounds, basic dye lake compounds, naphthol compounds, benzimidazolone compounds, thioindigo compounds and peryline compounds. Specific examples include C.I. pigment red 2, C.I. pigment red 3, C.I. pigment red 5, C.I. pigment red 6, C.I. pigment red 7, C.I. pigment violet 19, C.I. pigment red 23, C.I. pigment red 48:2, C.I. pigment red 48:3, C.I. pigment red 48:4, C.I. pigment red 57:1, C.I. pigment red 81:1, C.I. pigment red 122, C.I. pigment red 144, C.I. pigment red 146, C.I. pigment red 166, C.I. pigment red 169, C.I. pigment red 177, C.I. pigment red 184, C.I. pigment red 185, C.I.

pigment red 202, C.I. pigment red 206, C.I. pigment red 220, C.I. pigment red 221 and C.I. pigment red 254.

Examples of yellow colorants include condensed azo compounds, isoindolinone compounds, anthraquinone compounds, azo metal complexes, methine compounds and allylamido compounds. Specific examples include C.I. pigment yellow 12, C.I. pigment yellow 13, C.I. pigment yellow 1, C.I. pigment yellow 15, C.I. pigment yellow 17, C.I. pigment yellow 62, C.I. pigment yellow 74, C.I. pigment yellow 83, C.I. pigment yellow 93, C.I. pigment yellow 94, C.I. pigment yellow 95, C.I. pigment yellow 97, C.I. pigment yellow 109, C.I. pigment yellow 110, C.I. pigment yellow 111, C.I. pigment yellow 120, C.I. pigment yellow 127, C.I. pigment yellow 128, C.I. pigment yellow 129, C.I. pigment yellow 147, C.I. pigment yellow 151, C.I. pigment yellow 154, C.I. pigment yellow 155, C.I. pigment yellow 168, C.I. pigment yellow 174, C.I. pigment yellow 175, C.I. pigment yellow 176, C.I. pigment yellow 180, C.I. pigment yellow 181, C.I. pigment yellow 191 and C.I. pigment yellow 194.

Examples of black colorants include carbon black, magnetic powders, and blacks blended from yellow colorants, magenta colorants and cyan colorants.

These colorants can be used alone, or mixed, or used in a solid solution. The hue angle, chroma, lightness, lightfastness, OHP transparency, and dispersibility in the toner may be considered in selecting the colorant.

The content of the colorant is preferably from 1 to 20 mass parts per 100 mass parts of the resin component of the toner.

<Release Agent>

The toner of this invention may also contain a release agent, and examples include the following: polyethylene and other low-molecular-weight polyolefins; silicones having melting points (softening points) under heating; oleic acid amides, erucic acid amides, ricinoleic acid amides, stearic acid amides and other fatty acid amides; stearyl stearate and other ester waxes; carnuba wax, rice wax, candelilla wax, Japan wax, jojoba oil and other plant-based waxes; beeswax and other animal waxes; montan wax, ozocerite, ceresin, paraffin wax, microcrystalline wax, Fischer-Tropsch wax, ester wax and other mineral and petroleum waxes; and modified forms of these and the like.

The content of the release agent is preferably from 1 to 25 mass parts per 100 mass parts of the resin component of the toner.

<Toner Manufacturing Method>

In the toner of this invention, the crystalline resin is dispersed uniformly as minute domains several nanometers in size in a matrix of the amorphous resin, and the crystalline resin and the amorphous resin are thoroughly phase separated.

To manufacture this toner, it is desirable to perform the following two processes:

(1) first compatibilizing the crystalline resin and the amorphous resin and uniformly mixing the crystalline resin and the amorphous resin together in the toner or in the resin component of the toner; and (2) forming a phase-separated structure of the crystalline resin and the amorphous resin by a mechanism other than crystal growth of the crystalline resin due to conventional heat treatment.

Specifically, it is desirable to include the following steps during the manufacture of the toner:

a compatibilization step of heating the crystalline resin and the amorphous resin to equal to or above the melting point of the crystalline resin, or else of dissolving the crystalline resin and the amorphous resin in an organic solvent capable of dissolving the crystalline resin and the amorphous resin, to thereby compatibilize the crystalline resin and the amorphous resin in the toner or in the resin component of the toner, and obtain a compatibilized blend; and a solvent treatment step of treating the compatibilized blend with a good solvent for the amorphous resin and a poor solvent for the crystalline resin.

By passing through these steps, the crystalline resin is uniformly dispersed as minute domains several nanometers in size in a matrix of the amorphous resin, and the crystalline resin and the amorphous resin are thoroughly phase separated in the toner or the resin component of the toner.

<Compatibilization Step>

The compatibilization step is a step of compatibilizing the crystalline resin and the amorphous resin to obtain a compatibilized blend.

Specific examples include a step of heating the crystalline resin and the amorphous resin to equal to or above a melting point of the crystalline resin to thereby compatibilize the crystalline resin and the amorphous resin and obtain a compatibilized blend; and a step of dissolving the crystalline resin and the amorphous resin in an organic solvent capable of dissolving the crystalline resin and the amorphous resin, to thereby compatibilize the crystalline resin and the amorphous resin and obtain a compatibilized blend. Once the crystalline resin and the amorphous resin have been compatibilized, they can also be cooled or the organic solvent can be removed to obtain a compatibilized blend.

The heating temperature in the compatibilization step may be any temperature at equal to or above the melting point of the crystalline resin, or preferably a temperature 5° C. or more higher than the melting point of the crystalline resin, or more preferably a temperature 10° C. or more higher than the melting point of the crystalline resin.

The upper limit of the heating temperature in the compatibilization step is determined after considering the effects on costs and the like, and is not particularly limited, but is preferably a temperature about 140° C. higher than the melting point of the crystalline resin.

The crystalline resin and the amorphous resin are preferably a compatible combination so that the crystalline resin and the amorphous resin can be compatibilized in the compatibilization step.

In order for the crystalline resin and the amorphous resin to be compatibilized, the resulting toner preferably satisfies the following (Formula 3).

$$0.00 \leq \{Wt/(Wr \times Z/100)\} \leq 0.50 \qquad \text{(Formula 3)}.$$

Wt: An amount of heat of fusion (J/g) derived from the crystalline resin during second temperature rise in measurement of the toner by differential scanning calorimeter (DSC)

Wr: An amount of heat of fusion (J/g) during second temperature rise in measurement of the crystalline resin by differential scanning calorimeter (DSC)

Z: A content ratio (mass %) of the crystalline resin in the toner

The measurement methods using the differential scanning calorimeter (DSC) are as follows.

0.01 g to 0.02 g of toner or crystalline resin is accurately weighed into an aluminum pan, the temperature is raised from 0° C. to 200° C. at a ramp rate of 10° C./min, and a DSC curve for the first temperature rise is obtained. Next, the temperature is lowered to −100° C. from 200° C. at a rate of 10° C./min, and then raised again from −100° C. to 200°

C. at a ramp rate of 10° C./min, and the DSC curve for the second temperature rise is obtained.

In the DSC curve for the second temperature rise, the amount of heat of fusion (J/g) is determined from the area surrounded by the melting endothermic peak and a straight line extending the baseline of the low-temperature side to the high-temperature side.

When the crystalline resin and the amorphous resin are a compatible combination, the crystalline resin is melted by the first temperature rise, and becomes to be compatibilized with the amorphous resin. When this is subsequently cooled under the conditions described above, thorough crystallization does not occur, and the amount of heat of fusion (J/g) derived from the crystalline resin during the second temperature rise is lower as a result.

In Formula 3 above, the denominator is the product of "the amount of heat of fusion (Wr) of crystals observed in the crystalline resin by itself" and "the content ratio (Z) of the crystalline resin in the toner", and signifies the amount of heat of fusion when the crystalline resin contained in the toner is crystallized in the same way as the crystalline resin by itself.

Therefore, the greater the degree of compatibilization between the crystalline resin and the amorphous resin contained in the toner, or in other words the greater the compatibility between the crystalline resin and the amorphous resin, the more Wt will be smaller than (Wr×Z/100).

As $\{Wt/(Wr \times Z/100)\}$ exceeds 0.50, the degree of compatibilization between the crystalline resin and the amorphous resin in the compatibilization step will tend to decline, and the uniform dispersibility of the crystalline resin in the resulting toner will also tend to be less. Because of the lower compatibility between the crystalline resin and the amorphous resin, moreover, plasticization of the amorphous resin will not be sufficiently induced, and low-temperature fixability will tend to be less.

$\{Wt/(Wr \times Z/100)\}$ is more preferably at least 0.00 and not more than 0.40, or still more preferably at least 0.00 and not more than 0.30. A smaller value means that compatibilization is easier, and uniform dispersibility of the crystalline resin in the toner can be increased.

The toner may contain an added release agent or the like as necessary, and the melting endothermic peak of this release agent or the like may be observed. The melting endothermic peak of this release agent or the like can be distinguished from the melting endothermic peak derived from the crystalline resin using the differential scanning calorimeter, by first measuring the release agent or the like by itself and then comparing the resulting melting endothermic peak with the melting endothermic peak derived from the crystalline resin.

The release agent or the like by itself can be obtained from the toner by Soxhlet extraction using a hexane solvent, but the original added release agent itself may also be used.

Differential scanning calorimetric measurement of only the crystalline resin contained in the toner can be accomplished by extracting the release agent from the toner by Soxhlet extraction using a hexane solvent, separating out the crystalline resin using the different solubilities of the amorphous resin and crystalline resin in solvents, and then measuring the crystalline resin.

<Solvent Treatment Step>

The solvent treatment step is a step of treating the compatibilized blend with an organic solvent, with the organic solvent being a good solvent for the amorphous resin and a poor solvent for the crystalline resin.

This is a step of adding a specific organic solvent that is a good solvent for the amorphous resin and a poor solvent for the crystalline resin to the compatibilized blend obtained in the compatibilization step, to thereby precipitate the crystalline resin compatibilized with the amorphous resin, and obtain a solvent-treated product in which separation of a crystalline phase has been induced.

With this solvent treatment step, the crystalline resin and the amorphous resin are thoroughly phase separated, and the crystalline resin becomes uniformly dispersed as minute domains several nanometers in size in a matrix of the amorphous resin. The reasons for this are not clear, but may be as follows.

The solvent treatment step operates by a different mechanism from phase separation involving crystal growth of the crystalline resin caused by conventional heat treatment. This is because instead of inducing phase separation and crystal growth of the crystalline resin simultaneously by heat treatment, it exploits the different solubilities of the amorphous resin and the crystalline resin in an organic solvent.

That is, in the solvent treatment step, a solvent that is a good solvent for the amorphous resin and a poor solvent for the crystalline resin is added, causing only the crystalline resin compatibilized with the amorphous resin to crystallize and precipitate while the amorphous resin is in a solubilized state, and thereby achieving phase separation of the crystalline resin. As a result, adequate phase separation can be achieved without causing the domains of the crystalline resin to grow larger in the toner or the resin-component of the toner.

<Organic Solvent>

In this invention, the organic solvent used in the solvent treatment step may be any that is a good solvent for the amorphous resin and a poor solvent for the crystalline resin, without any particular limitations.

When the organic solvent is a good solvent for both the amorphous resin and the crystalline resin, it is difficult to precipitate the crystalline resin compatibilized with the amorphous resin in the compatibilization step.

On the other hand, when it is a poor solvent for both the amorphous resin and the crystalline resin, the solvent will not be able to penetrate the amorphous resin, and will thus not be able to penetrate the crystalline resin compatibilized with the amorphous resin and induce precipitation of the crystalline resin. In this invention, a poor solvent is a solvent in which a resin has a solubility of less than 10 g/L at the treatment temperature used in the solvent treatment step. A good solvent is a solvent in which a resin has a solubility of 100 g/L or more at the treatment temperature used in the solvent treatment step.

That is, in this invention a good solvent for the amorphous resin is a solvent in which the amorphous resin has a solubility of 100 g/L or more at the treatment temperature used in the solvent treatment step, and a poor solvent for the crystalline resin is a solvent in which the crystalline resin has a solubility of less than 10 g/L at the treatment temperature used in the solvent treatment step.

The greater the difference between the solubility of the amorphous resin and the solubility of the crystalline resin in the organic solvent the better. When the crystalline resin and the amorphous resin are in a compatibilized state as discussed above, the solubility of the crystalline resin at the treatment temperature used in the solvent treatment step is preferably 5 g/L or less for purposes of precipitating the crystalline resin.

In this invention, the solubilities of the amorphous resin and the crystalline resin in the organic solvent are calculated by the following method.

A specific mass quantity (1 to 200 g) of the amorphous resin or crystalline resin is added to 1 L of the organic solvent, and agitated for 12 hours at the treatment temperature (25° C. for example) of the solvent treatment step, and the solubility is evaluated based on the presence or absence of precipitates or turbidity.

Considering a case in which the organic solvent is added to an aqueous medium containing the compatibilized blend, phase separation of an oil phase may occur in the aqueous medium if the organic solvent has poor water solubility. If the compatibilized blend or the like becomes incorporated into this oil phase, a coarse powder is likely to be produced. Thus, the organic solvent is preferably a hydrophilic solvent. In this invention, a hydrophilic solvent is preferably one having a solubility of 50 g/L or more in water at the treatment temperature used in the solvent treatment step.

In this invention, specific examples of the organic solvent include, but are not limited to, ethyl acetate, methyl acetate, methyl ethyl ketone and isopropanol.

When treating the compatibilized blend with the organic solvent, treatment is preferably performed with thorough agitation so as not to produce coarse particles. Moreover, treatment with the organic solvent is preferably accomplished by dissolving or suspending the organic solvent in an aqueous medium containing a surfactant or the like, and then adding this to a dispersion of the compatibilized blend dispersed in an aqueous medium containing a surfactant or the like.

In this invention, the added amount of the organic solvent in the solvent treatment step cannot be generally specified because it depends on the type of crystalline resin and amorphous resin and the type of organic solvent used. Adding more solvent relative to the resin serves to promote plasticization of the amorphous resin, so that the solvent treatment step can progress rapidly. However, if too much is added the crystalline resin is more likely to dissolve in the organic solvent, and less likely to precipitate. Phase separation of the aforementioned oil phase also becomes more likely, and coarse powder is more likely to occur as a result.

Thus, the added amount of the organic solvent in the solvent treatment step is preferably at least 1 and not more than 500 mass parts, or more preferably at least 5 and not more than 250 mass parts, or still more preferably at least 5 and not more than 150 mass parts per 100 mass parts of the compatibilized blend. When using an organic solvent with poor solubility in water, the added amount of the organic solvent relative to the compatibilized blend can be increased by using ion exchange water or the like to dilute the concentration of the compatibilized blend in an aqueous dispersion.

The temperature for treatment with the organic solvent in the solvent treatment step may be any that causes the crystalline resin contained in the compatibilized blend to have a solubility within the aforementioned range.

At higher treatment temperatures, crystallization of the crystalline resin is induced rapidly as the viscosity of the amorphous resin decreases, but the crystalline resin is more likely to dissolve as it is when more solvent is added, and is thus less likely to precipitate.

In this invention, the temperature for treatment with the organic solvent is preferably a temperature at least 20° C. below the melting point of the crystalline resin, or more preferably at least 30° C. below the melting point of the crystalline resin, or still more preferably at least 40° C. below the melting point of the crystalline resin.

The time of treatment with the organic solvent in the solvent treatment step cannot be generally specified because it depends on the treatment temperature and the added amount of the organic solvent, but generally at least 30 minutes and not more than 10 hours is preferred.

Once the desired crystal phase has separated, the organic solvent can be removed by cooling and pressure reduction to obtain a solvent-treated product. In order to prevent dissolution of the crystalline resin and re-compatibilization of the crystalline resin and the amorphous resin, removal of the organic solvent is preferably performed at a temperature at least 30° C. below the melting point of the crystalline resin, or more preferably at least 40° C. below the melting point of the crystalline resin, or still more preferably at least 50° C. below the melting point of the crystalline resin. A still lower temperature is preferred.

This solvent treatment step may also be performed multiple times in order to form a specific phase-separation structure.

Structural Observation of Toner Cross-Section

With the solvent treatment step, the crystalline resin is adequately phase-separated from the amorphous resin, and the crystalline resin is dispersed uniformly as minute domains several nanometers in size in a matrix of the amorphous resin. This dispersed state can be confirmed by structural observation of a toner cross-section using a transmission electron microscope (TEM).

FIG. 1 shows a cross-section of a toner comprising a crystalline resin dispersed uniformly as minute domains several nanometers in size in a matrix of an amorphous resin. The minute domains that appear needle-shaped are the crystalline resin.

Figure 2:
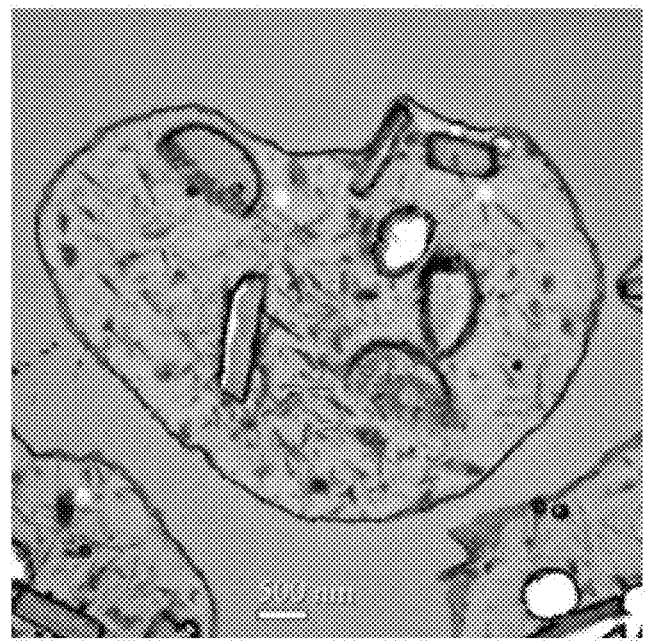
FIG. 2 is a transmission electron microscopic photograph of a conventional toner cross-section (photograph in lieu of drawing).

By contrast, FIG. 2 shows a cross-section of a toner comprising a crystalline resin that has undergone crystal growth to form domains larger than several nanometers in size. Although needle-shaped, the domains are larger than several nanometers in size.

The compatibilization step and solvent treatment step may be accomplished by known toner manufacturing methods such as the suspension polymerization, kneading pulverization, emulsion aggregation and dissolution suspension methods and the like, and are not restricted to any particular method.

Applications of the compatibilization step or solvent treatment step using the kneading pulverization and emulsion aggregation methods are given here as specific examples, but these examples are not limiting.

<Kneading Pulverization Method>

In the kneading pulverization method, the crystalline resin and amorphous resin which are the constituent materials of the toner are thoroughly mixed together with a release agent, colorant and other additives added as necessary, and melt kneaded with a heating roller, kneader or other known thermal kneading machine (kneading step). They are then mechanically pulverized to the desired toner particle diameter (pulverization step), and classified to obtain the desired particle size distribution (classification step), producing the toner.

In the kneading step, the crystalline resin and the amorphous resin present in the resent component of the toner are compatibilized by heating to equal to or above the melting point of the crystalline resin, to obtain a compatibilized blend. Next, this compatibilized blend is pulverized and classified to obtain resin particles. After this, these resin particles can be dispersed by a known method in an aqueous medium containing a surfactant, and an organic solvent can be added to the aqueous medium to perform the solvent treatment step.

<Kneading Step>

Melt kneading of the constituent materials of the toner can be accomplished using a known thermal kneading machine such as a heating roller and a kneader. In this kneading step, the constituent materials of the toner are preferably mixed thoroughly in advance with a mixer.

The mixer may be a HENSCHEL MIXER (Mitsui Mining Co., Ltd.), a super mixer (KAWATA MFG Co., Ltd.), a Ribocone (OKAWARA MFG CO., LTD), a Nauta Mixer, Turbulizer or Cyclomix (Hosokawa Micron), a spiral pin mixer (Pacific Machinery & Engineering Co., Ltd.), or a Loedige mixer (MATSUBO Corporation).

The thermal kneading machine may be a KRC kneader (KURIMOTO, LTD.), a Buss Ko-Kneader (Buss Corp.), a TEM extruder (TOSHIBA MACHINE CO., LTD.), a TEX biaxial kneader (Japan Steel Works, LTD.), a PCM kneader (Ikegai), a triple roll mill, mixing roll mill or kneader (INOUE MFG., INC.), a Kneadex (Mitsui Mining Co., Ltd.), an MS pressure kneader or kneader-rudder (Moriyama), or a Banbury Mixer (KOBE STEEL, LTD.).

<Pulverization Step>

The pulverization step is a step of first cooling the kneaded product obtained in the kneading step until it is hard enough to pulverize, and mechanically pulverizing the kneaded product to the particle size of the toner with a known pulverizing machine such as a target plate jet mill, fluidized-bed jet mill, rotary mechanical mill or the like. From the standpoint of pulverizing efficiency, it is desirable to use a fluidized-bed jet mill as the pulverizing machine.

The pulverizing machine may be a counter jet mill, micron jet or Inomizer (Hosokawa Micron), an IDS mill or PJM jet pulverizer (Nippon Pneumatic Mfg. Co., Ltd.), a Cross Jet Mill (KURIMOTO, LTD.), an Ulmax (NISSO ENGINEERING CO., LTD), an SK Jet-O-Mill (SEISHIN ENTERPRISE Co., Ltd.), a Kryptron (Kawasaki Heavy Industries, Ltd.), a Turbo Mill (FREUND TURBO), or a Super Rotor (Nisshin Engineering Inc.) or the like.

<Classification Step>

The classification step is a step of classifying the finely pulverized product obtained in the pulverization step to obtain a toner having a desired particle size distribution.

A known device such as an air classifier, inertial classifier or sieve classifier may be used as the classifier for classification. Specific examples include the Classiel, Micron Classifier and Spedic Classifier (SEISHIN ENTERPRISE Co., Ltd.), the Turbo Classifier (Nisshin Engineering Inc.), the Micron Separator and Turboplex (ATP), the TSP Separator (Hosokawa Micron), the Elbow Jet (Nittetsu Mining Co., Ltd.), the Dispersion Separator (Nippon Pneumatic Mfg. Co., Ltd.) and the YM Microcut (Yasukawa Shoji).

Silica, alumina, titania, calcium carbonate and other inorganic fine particles and vinyl resin, polyester resin, silicone resin and other resin fine particles may be added as necessary to a toner prepared via these steps by applying shear force in a dry state. These inorganic fine particles and resin fine particles function as external additives such as flowability aids and cleaning aids.

<Emulsion Aggregation Method>

The emulsion aggregation method is a method for preparing a toner by first preparing an aqueous dispersion of fine particles that consist of the constituent materials of the toner and are sufficiently small relative to the target particle size, aggregating those fine particles in an aqueous medium until the particle size of the toner is achieved, and then heating to fuse the resin.

That is, in the emulsion aggregation method, a toner is manufactured via a dispersion step of preparing a dispersion of fine particles consisting of the constituent materials of the toner, an aggregation step of aggregating the fine particles consisting of the constituent materials of the toner and controlling the particle size until the particle size of the toner is achieved, a fusion step of fusing the resin contained in the resulting aggregate particles, and a subsequent cooling step.

For example, in the fusion step, heating can be performed at equal to or above the melting point of the crystalline resin to thereby compatibilize the crystalline resin and the amorphous resin present in the aggregate particles and obtain a compatibilized blend.

Next, a specific organic solvent can be added to an aqueous dispersion containing this compatibilized blend to perform the solvent treatment step.

<Dispersion Step>

An aqueous dispersion containing fine particles of the amorphous resin and crystalline resin may be prepared by known methods, but the techniques are not limited. Examples of known methods include emulsion polymerization, self-emulsification, phase inversion emulsification in which a resin is emulsified by adding an aqueous medium to a solution of the resin dissolved in an organic solvent, and forced emulsification in which a resin is forcibly emulsified by high-temperature treatment in an aqueous medium, without an organic solvent.

Specifically, the amorphous resin and crystalline resin are dissolved in an organic solvent that dissolves both, and a surfactant or basic compound is added. Next, this is agitated with a homogenizer or the like as an aqueous medium is gradually added to thereby precipitate resin fine particles. Subsequently, the solvent is removed by heating or pressure reduction to prepare an aqueous dispersion of resin fine particles. The organic solvent used to dissolve the resin may be any capable of dissolving the resin, but an organic solvent such as tetrahydrofuran that forms a homogenous phase with water is preferred for suppressing the occurrence of coarse powder.

The surfactant used during this emulsification is not particularly limited, but examples include sulfuric acid ester salts, sulfonic acid salts, carboxylic acid salts, phosphate esters, soaps and other anionic surfactants; amine salts, quaternary ammonium salts and other cationic surfactants; and polyethylene glycols, alkyl phenol ethylene oxide adducts, polyvalent alcohols and other nonionic surfactants and the like. One kind of surfactant may be used alone, or two or more may be combined.

Examples of the basic compound used during this emulsification include sodium hydroxide, potassium hydroxide and other inorganic bases; and ammonia, triethylamine, trimethylamine, dimethylamino ethanol, diethylamino ethanol and other organic bases. One kind of base may be used alone, or two or more may be combined.

The 50% particle diameter on a volume basis (d50) of the fine particles of the amorphous resin is preferably from 0.05 to 1.0 µm, or more preferably from 0.05 to 0.4 µm.

Keeping the 50% particle diameter on a volume basis (d50) within this range makes it easy to obtain toner particles with a volume-average particle diameter of from 4.0 to 7.0 µm, which is a suitable size for toner particles.

The 50% particle diameter on a volume basis (d50) of the fine particles of the crystalline resin is preferably from 0.05 to 0.5 µm or more preferably from 0.05 to 0.3 µm from the standpoint of controlling the occurrence of coarse particles in the aggregation step. The 50% particle diameter on a volume basis (d50) can be measured using a dynamic light scattering particle size distribution analyzer (Nanotrac UPA-EX150: NIKKISO CO., LTD.).

An aqueous dispersion of colorant fine particles is used as necessary, and can be prepared by the known methods described below, but preparation is not limited to these methods.

This can be prepared by mixing a colorant, an aqueous medium and a dispersing agent in a known agitator, emulsifier, disperser or other mixer. The dispersing agent used here may be a known surfactant or polymeric dispersing agent.

The dispersing agent can be removed in the subsequent washing step regardless of whether it is a surfactant or a polymeric dispersing agent, but a surfactant is preferred from the standpoint of washing efficiency. Of the surfactants, anionic surfactants and nonionic surfactants are more preferred.

Examples of surfactants include sulfuric acid ester salts, sulfonic acid salts, phosphate esters, soaps and other anionic surfactants; amine salts, quaternary ammonium salts and other cationic surfactants; and polyethylene glycols, alkyl phenol ethylene oxide adducts, polyvalent alcohols and other nonionic surfactants.

Of these, a nonionic surfactant or anionic surfactant is preferred. A combination of a nonionic surfactant and an anionic surfactant may also be used. One kind of surfactant may be used, or a combination of two or more may be used.

The amount of the surfactant is preferably from 1 to 20 mass parts per 100 mass parts of the colorant, and from the standpoint of achieving both dispersion stability and washing efficiency, from 2 to 10 mass parts is more preferred.

The content of the colorant fine particles in the aqueous dispersion is not particularly limited, but is preferably from 1 to 30 mass % of colorant fine particles relative to the total mass of the aqueous dispersion.

Regarding the dispersed particle size of the colorant fine particles in the aqueous dispersion, a 50% particle diameter on a volume basis (d50) of 0.5 µm or less is preferred from the standpoint of dispersibility of the colorant in the final toner. For similar reasons, the 90% particle diameter on a volume basis (d90) is preferably 2 µm or less. The dispersed particle size of colorant fine particles dispersed in an aqueous medium is measured with a dynamic light scattering particle size distribution analyzer (Nanotrac UPA-EX150: NIKKISO CO., LTD.).

Examples of the known agitator, emulsifier, disperser or other mixer used for dispersing the colorant in the aqueous medium include ultrasonic homogenizers, jet mills, pressure homogenizers, colloid mills, ball mills, sand mills and paint shakers. These may be used alone or in combination.

An aqueous dispersion of release agent fine particles is used as necessary, and may be prepared by the known methods described below, but the methods are not limited to these.

An aqueous dispersion of release agent fine particles can be prepared by adding a release agent to an aqueous medium containing a surfactant, and heating to equal to or above the melting point of the release agent while dispersing it in particle form with a homogenizer capable of applying strong shear force (for example, M Technique Co., Ltd. Clearmix W-Motion) or a pressure discharge disperser (for example, a Gaulin Co. Gaulin Homogenizer), and then cooling to below the melting point.

Regarding the dispersed particle size of the release agent fine particles in the aqueous dispersion, the 50% particle diameter on a volume basis (d50) is preferably from 0.03 to 1.0 µm, or more preferably from 0.1 to 0.5 µm. Preferably no coarse particles of 1 µm or more are present.

When the dispersed particle size of the release agent fine particles is within this range, the release agent has good elution during fixing, the hot offset temperature can be raised, and filming on the photosensitive member can be repressed. The dispersed particle size of the release agent fine particles in the aqueous medium can be measured with a dynamic light scattering particle size distribution analyzer (Nanotrac UPA-EX150: NIKKISO CO., LTD.).

<Aggregation Step>

In the aggregation step, an aqueous dispersion of the amorphous resin fine particles and an aqueous dispersion of the crystalline resin fine particles are mixed together with an aqueous dispersion of release agent fine particles and an aqueous dispersion of colorant fine particles as necessary, to prepare a liquid mixture. Next, the fine particles contained in the resulting liquid mixture are aggregated to form aggregates of the desired particle diameter. An aggregating agent is added and mixed, and appropriate heat and/or mechanical force is applied as necessary during this process to form aggregate particles by aggregating the resin fine particles, colorant fine particles and release agent fine particles.

An aggregating agent containing bivalent or higher metal ions is preferably used as the aggregating agent. An aggregating agent containing bivalent or higher metal ions has strong aggregating force, and a small added amount can ionically neutralize the acidic polar groups of the resin fine particles and the ionic surfactant contained in the aqueous dispersions of resin fine particles, aqueous dispersion of colorant fine particles and aqueous dispersion of release agent fine particles. As a result, the resin fine particles, colorant fine particles and release agent fine particles are aggregated by the effects of salting-out and ionic cross-linking.

Examples of aggregating agents containing bivalent or higher metal ions include bivalent and higher metals salts and polymers of metal salts. Specific examples include, but are not limited to, calcium chloride, calcium nitrate, magnesium chloride, magnesium sulfate, zinc chloride and other bivalent inorganic metal salts, iron chloride (III), iron sulfate (III), aluminum sulfate, aluminum chloride and other trivalent metal salts, and polyaluminum chloride, polyaluminum hydroxide, calcium polysulfide and other inorganic metal salt polymers. One kind may be used alone, or two or more may be combined.

The aggregating agent may be added either as a dry powder or as an aqueous solution of the agent dissolved in an aqueous medium, but for purposes of achieving uniform aggregation, an aqueous solution is preferred.

The aggregating agent is preferably added and mixed at a temperature no greater than the glass transition temperature of the resin contained in the liquid mixture. Uniform aggregation is promoted by mixing under these temperature conditions. The aggregating agent may be mixed into the liquid mixture using a homogenizer, mixer or other known mixing apparatus.

The average particle diameter of the aggregate particles formed in the aggregation step is not particularly limited, and is normally controlled so as to obtain roughly the same particle diameter as that of the final particles to be obtained. The particle diameter of the aggregate particles can be easily controlled by appropriately adjusting the temperature, solids concentration, concentration of the aggregating agent and agitation conditions.

Toner particles having a core-shell structure can be manufactured by including a shell attachment step of further adding resin fine particles for forming a shell phase to the liquid dispersion of aggregate particles obtained in the aggregation step, and attaching the resin fine particles to the surface of the aggregate particles, after which the aggregate particles with the resin fine particles attached to the surfaces thereof are fused in the subsequent fusion step (discussed below). The resin fine particles added here for forming a shell phase may be resin particles having the same structure as a resin contained in the aggregate particles, or resin particles having a different structure.

<Fusion Step>

In the fusion step, an aggregation terminator is added under the same agitation used in the aggregation step to a liquid dispersion containing the aggregate particles obtained in the aggregation step. Examples of the aggregation terminator include a basic compound that stabilizes the aggregate particles by shifting the equilibrium of the acidic polar groups in the resin fine particles towards dissociation; and a chelating agent that stabilizes the aggregate particles by partially dissociating the ion crosslinkages between the acidic polar groups of the resin fine particles and the metal ions of the aggregating agent, forming coordinate bonds with the metal ions. Of these, chelating agents are preferred for their stronger aggregation terminating effects.

Once the dispersion state of the aggregate particles in the liquid dispersion has been stabilized by the action of the aggregation terminator, the dispersion is heated to equal to or above the glass transition temperature of the amorphous resin to fuse the aggregate particles.

When the compatibilization step is performed at the same time as the fusion step, heating is performed to equal to or above the melting point of the crystalline resin to fuse the aggregate particles.

Moreover, when the fusion step is performed after the compatibilization step and the solvent treatment step, heating can be performed below the melting point of the crystalline resin so that the crystalline resin and the amorphous resin do not re-compatibilize.

The chelating agent may be a known water-soluble chelating agent, without any particular limitations. Specific examples include tartaric acid, citric acid, gluconic acid and other oxycarboxylic acids and sodium salts of these; and iminodiacetic acid (IDA), nitrilotriacetic acid (NTA), ethylenediamine tetraacetic acid (EDTA) and sodium salts of these.

By coordinating the metal ions of the aggregating agent present in the liquid dispersion of aggregate particles, the chelating agent can change the environment in the liquid dispersion from a statically unstable, aggregation-prone state to a statically stable state that resists further aggregation. It is thus possible to prevent further aggregation of the aggregate particles in the dispersion, stabilizing the aggregate particles.

In order to be effective even when a small amount is added and produce toner particles with a sharp particle size distribution, the chelating agent is preferably an organic metal salt having a trivalent or higher carboxylic acid.

From the standpoint of achieving both washing efficiency and stabilization from an aggregated state, the added amount of the chelating agent is preferably from 1 to 30 mass parts or more preferably from 2.5 to 15 mass parts per 100 mass parts of the resin particles.

The solvent treatment step can be carried out by adding the specific organic solvent to an aqueous dispersion containing the particles obtained in the fusion step.

The solvent-treated particles are then washed, filtered, dried and the like to obtain a toner. Next, silica, alumina, titania, calcium carbonate and other inorganic fine particles and vinyl resin, polyester resin, silicone resin and other resin fine particles may be added by applying shear force in a dry state. These inorganic fine particles and resin fine particles function as external additives such as flowability aids and cleaning aids.

EXAMPLES

This invention is explained in more detail below using examples and comparative examples, but the invention is not limited to these embodiments. Unless otherwise specified, parts and percentages in the examples and comparative examples represent mass parts and percentages.

| Manufacture of amorphous resin fine particles 1 | |
|---|---|
| Tetrahydrofuran (Wako Pure Chemical Industries, Ltd.) | 200 g |
| Polyester resin A [Composition (mol %): polyoxypropylene(2.2)-2,2-bis(4-hydroxyphenyl)propane:isophthalic acid:terephthalic acid = 100:50:50, number-average molecular weight (Mn) = 4,600, weight-average molecular weight (Mw) = 16,500, peak molecular weight (Mp) = 10,400, Mw/Mn = 3.6, softening temperature (Tm) = 122° C., glass transition temperature (Tg) = 70° C., acid value = 13 mg KOH/g] | 120 g |
| Anionic surfactant (DKS Co. Ltd., Neogen RK) | 0.6 g |

[Composition (mol %): polyoxypropylene(2.2)-2,2-bis(4-hydroxyphenyl)propane:isophthalic acid: terephthalic acid=100:50:50, number-average molecular weight (Mn)=4,600, weight-average molecular weight (Mw)=16,500, peak molecular weight (Mp)=10,400, Mw/Mn=3.6, softening temperature (Tm)=122° C., glass transition temperature (Tg)=70° C., acid value=13 mg KOH/g]

Anionic surfactant 0.6 g (DKS Co. Ltd., Neogen RK)

These ingredients were mixed and then agitated for 12 hours to dissolve the resin.

2.7 g of N,N-dimethylaminoethanol was then added, and the mixture was agitated at 4000 rpm with a T.K. Robomix high speed mixing system (PRIMIX Corporation).

360 g of ion-exchange water was then added at a rate of 1 g/min to precipitate resin fine particles. The tetrahydrofuran was then removed with an evaporator to obtain amorphous resin fine particles 1 and a liquid dispersion thereof.

The 50% particle diameter on a volume basis (d50) of the amorphous resin fine particles 1 was 0.13 μm as measured with a dynamic light scattering particle size distribution analyzer (Nanotrac: NIKKISO CO., LTD.).

Manufacture of Amorphous Resin Fine Particles 2

Amorphous resin fine particles 2 and a liquid dispersion thereof were obtained in the same way as the amorphous resin fine particles 1 except that the polyester resin A was replaced with a polyester resin B [Composition (mol %): polyoxypropylene(2.2)-2,2-bis(4-hydroxyphenyl)propane: polyoxyethylene(2.0)-2,2-bis(4-hydroxyphenyl)propane:terephthalic acid dodecylsuccinic acid: trimellitic acid=33:17:24:20:6, Mn=4,600, Mw=62,000, Mp=8,500, Mw/Mn=12.9, Tm=120° C., Tg=56° C., acid value=11 mg KOH/g]. The 50% particle diameter on a volume basis (d50) of the resulting amorphous resin fine particles 2 was 0.15 µm.

Manufacture of Amorphous Resin Fine Particles 3

Amorphous resin fine particles 3 and a liquid dispersion thereof were obtained in the same way as the amorphous resin fine particles 1 except that the polyester resin A was replaced with a polyester resin C [Composition (mol %):polyoxyethylene(2.0)-2,2-bis(4-hydroxyphenyl)propane:terephthalic acid=50:50, Mn=3,900, Mw=12,300, Mw/Mn=3.1, Tm=109° C., Tg=58° C., acid value=12 mg KOH/g]. The 50% particle diameter on a volume basis (d50) of the resulting amorphous resin fine particles 3 was 0.12 µm.

| Manufacture of crystalline resin fine particles 1 | |
|---|---|
| Tetrahydrofuran (Wako Pure Chemical Industries, Ltd.) | 200 g |
| Crystalline polyester resin A [Composition (mol %): 1,9-nonanediol:sebacic acid = 100:100, number-average molecular weight (Mn) = 5,500, weight-average molecular weight (Mw) = 15,500, peak molecular weight (Mp) = 11,400, Mw/Mn = 2.8, melting point = 78° C., acid value = 13 mg KOH/g] | 120 g |
| Anionic surfactant (DKS Co., Ltd., Neogen RK) | 0.6 g |

[Composition (mol %): 1,9-nonanediol: sebacic acid=100:100, number-average molecular weight (Mn)=5,500, weight-average molecular weight (Mw)=15,500, peak molecular weight (Mp)=11,400, Mw/Mn=2.8, melting point=78° C., acid value=13 mg KOH/g]

Anionic surfactant 0.6 g (DKS Co., Ltd., Neogen RK)

These ingredients were mixed and then agitated for 3 hours at 50° C. to dissolve the resin.

2.7 g of N,N-dimethylaminoethanol was then added, and the mixture was agitated at 4000 rpm with a T.K. Robomix high speed mixing system (PRIMIX Corporation).

360 g of ion-exchange water was then added at a rate of 1 g/min to precipitate resin fine particles.

The tetrahydrofuran was then removed with an evaporator to obtain crystalline resin fine particles 1 and a liquid dispersion thereof.

The 50% particle diameter on a volume basis (d50) of the crystalline resin fine particles 1 was 0.30 µm as measured with a dynamic light scattering particle size distribution analyzer (Nanotrac: NIKKISO CO., LTD.).

The polyester resins A to C and crystalline polyester resin A were each added to ethyl acetate and agitated for 12 hours in an environment of 25° C., and solubility was evaluated. The results confirmed that ethyl acetate is a good solvent for the polyester resins A to C (amorphous resins) and a poor solvent for the crystalline polyester resin A (crystalline resin).

| Manufacture of colorant fine particles | |
|---|---|
| Colorant (cyan pigment, Dainichiseika Pigmen Blue 15:3) | 10.0 parts |
| Anionic surfactant (DKS Co., Ltd., Neogen RK) | 1.5 parts |
| Ion-exchange water | 88.5 parts |

These ingredients were mixed, dissolved, and dispersed for about an hour with a high-pressure impact disperser (Nanomizer, yoshida kikai co., ltd.) to disperse the colorant and prepare a liquid dispersion of colorant fine particles.

The 50% particle diameter on a volume basis (d50) of the resulting colorant fine particles was 0.20 µm as measured with a dynamic light scattering particle size distribution analyzer (Nanotrac: NIKKISO CO., LTD.).

| Manufacture of release agent fine particles | |
|---|---|
| Release agent (HNP-51, melting point 78° C., NIPPON SEIRO CO., LTD.) | 20.0 parts |
| Anionic surfactant (DKS Co. Ltd., Neogen RK) | 1.0 part |
| Ion-exchange water | 79.0 parts |

These ingredients were placed in a mixer equipped with an agitator, heated to 90° C., and dispersed for 60 minutes by agitating under conditions of rotor speed 19000 rpm, screen speed 19000 rpm in a shear agitation site with an outer rotor diameter of 3 cm and a clearance of 0.3 mm while being circulated to a Clearmix W-Motion (M Technique Co., Ltd.).

This was then cooled to 40° C. under cooling conditions of rotor speed 1000 rpm, screen speed 0 rpm, cooling rate 10° C./min to obtain a liquid dispersion of release agent fine particles. The 50% particle diameter on a volume basis (d50) of the release agent fine particles was 0.15 µm as measured with a dynamic light scattering particle size distribution analyzer (Nanotrac: NIKKISO CO., LTD.).

Example 1

| <Manufacture of Toner 1> | |
|---|---|
| Liquid dispersion of amorphous resin fine particles 1 | 320 mass parts |
| Liquid dispersion of crystalline resin fine particles 1 | 80 mass parts |
| Liquid dispersion of colorant fine particles | 50 mass parts |
| Liquid dispersion of release agent fine particles | 50 mass parts |
| Ion-exchange water | 400 mass parts |

These materials were placed in a round-bottomed stainless-steel flask and mixed, after which an aqueous solution of 2 parts magnesium sulfate dissolved in 98 parts of ion-exchange water was added, and the mixture was dispersed for 10 minutes at 5000 rpm with a homogenizer (IKA Co. Ultra-Turrax T50).

This was then heated to 58° C. in a heating water bath with a stirring blade with the rotation controlled appropriately to agitate the mixture, and maintained at 58° C. for 1 hour to yield aggregate particles with a volume-average particle diameter of about 6.0 µm.

A solution of 20 mass parts of trisodium citrate dissolved in 380 parts of ion-exchange water was added to a liquid dispersion containing these aggregate particles, which was then heated to 85° C.

This was maintained at 85° C. for 2 hours to obtain toner particles with a volume-average particle diameter of about 5.8 µm and an average circularity of 0.968.

The volume-average particle diameter of the particles was measured with a Coulter Multisizer III (Beckman Coulter, Inc.) in accordance with the operating manual. The average circularity was measured and calculated using a Sysmex FPIA-3000 flow particle imaging instrument in accordance with the attached manual.

The aqueous dispersion of toner particles obtained was cooled to 25° C. with continuing agitation, 15 parts of ethyl acetate were added, and the mixture was kept sealed for 3 hours.

The pressure was then reduced with an evaporator with the temperature maintained at 25° C. to remove the ethyl acetate, and following filtration and solid-liquid separation, the filtrate was thoroughly washed with ion-exchange water and dried with a vacuum drier to obtain toner 1 with a volume-average particle diameter of 5.4 μm. The formulation and properties of the resulting toner 1 are shown in Tables 1 and 2.

Example 2

| <Manufacture of Toner 2> | |
| --- | --- |
| Liquid dispersion of amorphous resin fine particles 2 | 348 parts |
| Liquid dispersion of crystalline resin fine particles 1 | 52 parts |
| Liquid dispersion of colorant fine particles | 50 parts |
| Liquid dispersion of release agent fine particles | 50 parts |
| Ion-exchange water | 400 parts |

These materials were placed in a round-bottomed stainless-steel flask and mixed, after which an aqueous solution of 2 parts magnesium sulfate dissolved in 98 parts of ion-exchange water was added, and the mixture was dispersed for 10 minutes at 5000 rpm with a homogenizer (IKA Co. Ultra-Turrax T50).

This was then heated to 50° C. in a heating water bath using a stirring blade with the rotational frequency controlled appropriately to agitate the mixture, and maintained at 50° C. for 1 hour to yield aggregate particles with a volume-average particle diameter of about 5.8 μm.

A solution of 20 parts of trisodium citrate dissolved in 380 parts of ion-exchange water was added to a liquid dispersion containing these aggregate particles, which was then heated to 80° C. This was maintained for 2 hours at 80° C. to obtain toner particles with a volume-average particle diameter of about 5.6 μm and an average circularity of 0.965.

An aqueous dispersion of the resulting toner particles was cooled to 25° C. with continuing agitation, 15 parts of ethyl acetate were added, and the mixture was kept sealed for 3 hours.

The pressure was then reduced with an evaporator with the temperature maintained at 25° C. to remove the ethyl acetate, and following filtration and solid-liquid separation, the filtrate was thoroughly washed with ion-exchange water and dried with a vacuum drier to obtain a toner 2 with a volume-average particle diameter of 5.3 μm. The formulation and properties of the resulting toner 2 are shown in Tables 1 and 2.

Example 3

| <Manufacture of Toner 3> | |
| --- | --- |
| Polyester resin A | 80 parts |
| Crystalline polyester resin A | 20 parts |
| Colorant (cyan pigment, Dainichiseika Pigment Blue 15:3) | 5 parts |
| Release agent (HNP-51, melting point 78° C., NIPPON SEIRO CO., LTD.) | 5 parts |

(HNP-51, melting point 78° C., NIPPON SEIRO CO., LTD.)

These raw materials were pre-mixed in a HENSCHEL MIXER, and then kneaded for 1 hour with a biaxial kneading extruder (PCM-30, Ikegai Kogyo) set to 130° C., 200 rpm.

The resulting kneaded product was cooled and coarsely pulverized with a cutter mill, and the resulting coarsely pulverized product was finely pulverized with a T-250 Turbo Mill (FREUND TURBO) and classified with a multi-grade classifier utilizing the Coanda effect to obtain toner particles with a volume-average particle diameter of 5.8 μm.

100 parts of the resulting toner particles were added to an aqueous solution of 10 parts of anionic surfactant (DKS Co., Ltd., Neogen RK) dissolved in 890 parts of ion-exchange water, and the mixture was exposed to ultrasound for 1 hour with an ultrasonic disperser (Ultrasonic Dispersion System Tetora 150 (Nikkaki Bios Co., Ltd.)) to obtain an aqueous dispersion of toner particles.

The resulting aqueous dispersion of toner particles was then adjusted to 25° C., the aqueous dispersion was agitated with a stirring blade as 15 parts of ethyl acetate were added, and the mixture was kept sealed for 3 hours.

The ethyl acetate was then removed with an evaporator, and following filtration and solid-liquid separation, the filtrate was thoroughly washed with ion-exchange water and dried with a vacuum drier to obtain a toner 3 with a volume-average particle diameter of 5.8 μm. The formulation and properties of the toner 3 are shown in Tables 1 and 2.

Example 4

Manufacture of Toner 4

20 parts of cyan pigment (Dainichiseika Pigment Blue 15:3) as a colorant, 180 parts of toluene as a solvent and 130 parts of glass beads (dia. 1 mm) were mixed, dispersed for 3 hours in an attritor (NIPPON COKE & ENGINEERING CO., LTD.), and filtered with a mesh to obtain a colorant-dispersed solution.

Next, 11.7 parts of sodium triphosphate dodecahydrate (Wako Pure Chemical Industries, Ltd.) and 1200 parts of ion-exchange water were added to a beaker set in a water bath, and the sodium triphosphate dodecahydrate was dissolved. The temperature of the water bath was then raised to 60° C. After 60° C. was reached, an aqueous solution of 5.15 parts of calcium chloride (Kishida Chemical Co.) dissolved in 100 parts of ion-exchange water was added. After this addition the mixture was agitated for 30 minutes to obtain an aqueous medium containing tricalcium phosphate.

| Polyester resin A | 80 parts |
| --- | --- |
| Crystalline polyester resin A | 20 parts |
| Colorant-dispersed solution | 50 parts |
| Release agent (HNP-51, melting point 78° C., NIPPON SEIRO CO., LTD.) | 10 parts |
| Toluene | 350 parts |

These ingredients were mixed, the temperature was raised to 80° C. with agitation, and the materials were dissolved and dispersed to prepare a resin component.

Meanwhile, 600 parts of the aforementioned aqueous medium containing tricalcium phosphate was agitated with a Clearmix (M Technique Co., Ltd.) while being heated to 80° C. The resin component was added to the aqueous medium containing tricalcium phosphate, and agitated for 10 minutes at 10000 rpm to obtain a liquid dispersion. The resulting liquid dispersion was agitated with a stirring blade with continued heating at 80° C. for 5 hours to remove the toluene. This was then cooled to 25° C. over the course of 10 minutes, to obtain an aqueous dispersion of toner particles.

The resulting aqueous dispersion of toner particles was kept at 25° C. with continuing agitation, 15 parts of ethyl acetate were added, and the mixture was kept sealed for 3 hours.

The pressure was then reduced with an evaporator with the temperature maintained at 25° C. to remove the ethyl acetate, and dilute hydrochloric acid was added with agitation. This was agitated for 2 hours at pH 1.5 to dissolve the tricalcium phosphate, and solid-liquid separation was performed with a filtration unit to obtain toner particles.

These were placed in water and agitated to once again obtain a liquid dispersion, which was subjected to solid-liquid separation with a filtration unit. This operation was repeated until the tricalcium phosphate had been thoroughly removed, and the resulting toner particles were thoroughly dried in a drier to obtain a toner 4 with a volume-average particle diameter of 6.2 μm. The formulation and properties of the toner 4 are shown in Table 1 and Table 2.

Comparative Example 1

| <Manufacture of Toner 5> | |
|---|---|
| Liquid dispersion of amorphous resin fine particles 1 | 320 parts |
| Liquid dispersion of crystalline resin fine particles 1 | 80 parts |
| Liquid dispersion of colorant fine particles | 50 parts |
| Liquid dispersion of release agent fine particles | 50 parts |
| Ion-exchange water | 400 parts |

These materials were placed in a round-bottomed stainless-steel flask and mixed, after which an aqueous solution of 2 parts magnesium sulfate dissolved in 98 parts of ion-exchange water was added, and the mixture was dispersed for 10 minutes at 5000 rpm with a homogenizer (IKA Co. Ultra-Turrax T50).

This was then heated to 58° C. in a heating water bath using a stirring blade with the rotational speed controlled appropriately to agitate the mixture, and maintained at 58° C. for 1 hour to yield aggregate particles with a volume-average particle diameter of about 6.0 μm.

A solution of 20 parts of trisodium citrate dissolved in 380 parts of ion-exchange water was added to a liquid dispersion containing these aggregate particles, which was then heated to 85° C. This was maintained for 3 hours at 85° C. in a sealed condition to obtain thoroughly fused toner particles with a volume-average particle diameter of about 5.8 μm and an average circularity of 0.975.

Water was then added to the water bath, the aqueous dispersion of toner particles was cooled to 25° C., and following filtration and solid-liquid separation, the filtrate was thoroughly washed with ion-exchange water and dried with a vacuum drier to obtain a toner 5 with a volume-average particle diameter of 5.4 μm. The formulation and properties of the resulting toner 5 are shown in Tables 1 and 2.

Comparative Example 2

| <Manufacture of Toner 6> | |
|---|---|
| Liquid dispersion of amorphous resin fine particles 1 | 320 parts |
| Liquid dispersion of crystalline resin fine particles 1 | 80 parts |
| Liquid dispersion of colorant fine particles | 50 parts |
| Liquid dispersion of release agent fine particles | 50 parts |
| Ion-exchange water | 400 parts |

These materials were placed in a round-bottomed stainless-steel flask and mixed, after which an aqueous solution of 2 parts of magnesium sulfate dissolved in 98 parts of ion-exchange water was added, and the mixture was dispersed for 10 minutes at 5000 rpm with a homogenizer (IKA Co. Ultra-Turrax T50).

This was then heated to 58° C. in a heating water bath using a stirring blade with the rotational speed controlled appropriately to agitate the mixture, and maintained at 58° C. for 1 hour to yield aggregate particles with a volume-average particle diameter of about 6.0 μm.

An aqueous solution of 20 parts of trisodium citrate dissolved in 380 parts of ion-exchange water was added to a liquid dispersion containing these aggregate particles, which was then heated to 85° C. This was maintained for 3 hours at 85° C. to obtain thoroughly fused toner particles with a volume-average particle diameter of about 5.8 μm and an average circularity of 0.975.

Water was then added to the water bath, the aqueous dispersion of toner particles was cooled to 25° C., and the mixture was heated again to 50° C. and maintained for 12 hours as an annealing treatment by heating. The aqueous dispersion of toner particles was then cooled to 25° C., and following filtration and solid-liquid separation, the filtrate was thoroughly washed with ion-exchange water and dried with a vacuum drier to obtain a toner 6 with a volume-average particle diameter of 5.4 μm. The formulation and properties of the resulting toner 6 are shown in Tables 1 and 2.

Comparative Example 3

| <Manufacture of Toner 7> | |
|---|---|
| Liquid dispersion of amorphous resin fine particles 3 | 320 parts |
| Liquid dispersion of crystalline resin fine particles 1 | 80 parts |
| Liquid dispersion of colorant fine particles | 50 parts |
| Liquid dispersion of release agent fine particles | 50 parts |
| Ion-exchange water | 400 parts |

These materials were placed in a round-bottomed stainless-steel flask and mixed, after which an aqueous solution of 2 parts of magnesium sulfate dissolved in 98 parts of ion-exchange water was added, and the mixture was dispersed for 10 minutes at 5000 rpm with a homogenizer (IKA Co. Ultra-Turrax T50).

This was then heated to 53° C. in a heating water bath using a stirring blade with the rotational speed controlled appropriately to agitate the mixture, and maintained at 53° C. for 1 hour to yield aggregate particles with a volume-average particle diameter of about 5.8 μm.

A solution of 20 parts of trisodium citrate dissolved in 380 parts of ion-exchange water was added to a liquid dispersion containing these aggregate particles, which was then heated to 80° C. This was maintained in a sealed condition for 3 hours at 80° C. to obtain thoroughly fused toner particles with a volume-average particle diameter of about 5.5 μm and an average circularity of 0.981.

An aqueous dispersion of the resulting toner particles was cooled to 25° C. with continuing agitation, 15 parts of ethyl acetate were added, and the mixture was kept sealed for 3 hours.

The pressure was then reduced with an evaporator with the temperature maintained at 25° C. to remove the ethyl acetate, and following filtration and solid-liquid separation, the filtrate was thoroughly washed with ion-exchange water and dried with a vacuum drier to obtain a toner 7 with a volume-average particle diameter of 5.2 μm. The formulation and properties of the resulting toner 7 are shown in Tables 1 and 2.

Comparative Example 4

| <Manufacture of Toner 8> | |
|---|---|
| Polyester resin B | 80 parts |
| Crystalline polyester resin A | 20 parts |
| Colorant (cyan pigment, Dainichiseika Pigment Blue 15:3) | 5 parts |
| Release agent (HNP-51, melting point 78° C., NIPPON SEIRO CO., LTD.) | 5 parts |

(HNP-51, melting point 78° C., NIPPON SEIRO CO., LTD.)

These raw materials were pre-mixed in a HENSCHEL MIXER, and then kneaded for 5 hours with a biaxial kneading extruder (PCM-30, Ikegai Kogyo) set to 62° C., 200 rpm.

The resulting kneaded product was cooled and coarsely pulverized with a cutter mill, and the resulting coarsely pulverized product was finely pulverized with a T-250 Turbo Mill (FREUND TURBO) and classified with a multi-grade classifier utilizing the Coanda effect to obtain a Toner 8 with a volume-average particle diameter of 5.8 μm. The formulation and properties of the Toner 8 are shown in Table 1 and Table 2.

Comparative Example 5

| <Manufacture of Toner 9> | |
|---|---|
| Polyester resin A | 80 parts |
| Crystalline polyester resin A | 20 parts |
| Colorant (cyan pigment, Dainichiseika Pigment Blue 15:3) | 5 parts |
| Release agent (HNP-51, melting point 78° C., NIPPON SEIRO CO., LTD.) | 5 parts |

(HNP-51, melting point 78° C., NIPPON SEIRO CO., LTD.)

These raw materials were pre-mixed in a HENSCHEL MIXER, and then kneaded for 1 hour with a biaxial kneading extruder (PCM-30, Ikegai Kogyo) set to 130° C., 200 rpm.

The resulting kneaded product was cooled and coarsely pulverized with a cutter mill, and the resulting coarsely pulverized product was finely pulverized with a T-250 Turbo Mill (FREUND TURBO) and classified with a multi-grade classifier utilizing the Coanda effect to obtain a Toner 9 with a volume-average particle diameter of 5.8 μm. The formulation and properties of the Toner 9 are shown in Table 1 and Table 2.

Comparative Example 6

Manufacture of Toner 10

The colorant-dispersed solution and the aqueous medium containing tricalcium phosphate obtained in Example 4 were used.

| | |
|---|---|
| Polyester resin A | 80 parts |
| Crystalline polyester resin A | 20 parts |
| Colorant-dispersed solution | 50 parts |
| Release agent (HNP-51, melting point 78° C., Nippon Seiro) | 10 parts |
| Toluene | 350 parts |

These ingredients were mixed, the temperature was raised to 80° C. with agitation, and the materials were dissolved and dispersed to prepare a resin component.

Meanwhile, 600 parts of the aqueous medium containing tricalcium phosphate was agitated with a Clearmix (M Technique Co., Ltd.) while being heated to 80° C. The resin component was added to the aqueous medium containing tricalcium phosphate, and agitated for 10 minutes at 10000 rpm to obtain a liquid dispersion. The resulting liquid dispersion was agitated with a stirring blade while being heated continuously at 80° C. for 5 hours to remove the toluene. This was then cooled to 25° C. over the course of 10 minutes, to obtain an aqueous dispersion of toner particles.

The resulting aqueous dispersion of toner particles was agitated as dilute hydrochloric acid was added, and the mixture was agitated for 2 hours at pH 1.5 to dissolve the tricalcium phosphate, after which solid-liquid separation was performed with a filtration unit to obtain toner particles.

These were placed in water and agitated to once again obtain a liquid dispersion, which was then subjected to solid-liquid separation with a filtration unit. This operation was repeated until the tricalcium phosphate had been thoroughly removed, and the resulting toner particles were thoroughly dried in a drier to obtain a toner 10 with a volume-average particle diameter of 6.2 μm. The formulation and properties of the toner 10 are shown in Table 1 and Table 2.

Evaluation of Toner Properties

The following evaluations were performed using the Toners 1 to 10. The results are shown in Table 1.

The evaluations were performed using a toner with an external additive, obtained by dry mixing 1.8 parts of fine silica particles that had been hydrophobic-treated with silicone oil and had a specific surface area of 200 $m^2/g$ by the BET method into 100 parts of toner particles with a HENSCHEL MIXER (Mitsui Mining Co., Ltd.).

<Storability Evaluation>

The toner was left standing for 3 days in a thermohygrostat, and screened for 300 seconds with a shaking width of 1 mm using a 75 μm mesh screen, and the amount of toner remaining on the screen was evaluated according to the following standard.

(Evaluation Standard)

A: Less than 10% of toner remains on screen upon screening after 3 days' still standing in a thermohygrostat at 55° C., 10% RH.

B: 10% or more of toner remains on screen upon screening after 3 days' still standing in a thermohygrostat at 55° C., 10% RH, but less than 10% of toner remains on screen upon screening after 3 days' still standing in a thermohygrostat at 50° C., 10% RH.

C: 10% or more of toner remains on screen upon screening after 3 days' still standing in a thermohygrostat at 50° C., 10% RH.

<Low-Temperature Fixability Evaluation>

The toner with the external additive used above was mixed to a toner concentration of 8 mass % with a ferrite carrier (average particle diameter 42 μm) surface coated with silicone resin to prepare a two-component developer. This two-component developer was loaded into a commercial full-color digital printer (CLC1100, Canon Inc.), and an unfixed toner image (0.6 mg/cm$^2$) was formed on image receiving paper (64 g/m$^2$). A fixing unit that had been removed from a commercial full color digital copier (imageRUNNER ADVANCE C5051, Canon Inc.) was modified to allow adjustment of the fixation temperature, and used to perform a fixing test with the unfixed toner image. At normal temperature, normal humidity with the process speed set to 246 mm/second, the condition after the unfixed toner image was fixing was evaluated visually.

(Evaluation Standard)

A: Fixing possible at temperature range of 120° C.
B: Fixing possible at temperatures higher than 120° C. and no higher than 125° C.
C: Fixing possible at temperatures higher than 125° C. and no higher than 130° C.
D: Fixing possible at temperatures higher than 130° C. and no higher than 140° C.
E: Fixing only possible at a temperature range above 140° C.

<Charging Performance Evaluation>

Using the two-component developer used to evaluate low-temperature fixability, the triboelectric charge of the toner was measured, and the charging performance of the toner was evaluated according to the following standard.

The triboelectric charge quantity of the toner was measured with a Hosokawa Micron E-SPART ANALYZER. The E-SPART ANALYZER is a device that introduces sample particles into a detection part (measurement part) with a simultaneously formed electrical field and sound field, measures the rate of particle movement by the laser doppler method, and measures the particle size and quantity of charge. Once they enter the measurement part of the device, the sample particles are affected by the sound field and electrical field, deviating horizontally as they fall, and the beat frequency of the horizontal speed is counted. The count value is input interruptively into a computer, and the particle size distribution or charge quantity distribution for each unit particle size is displayed on the computer screen in real time. When the charge quantity of a specific number is measured, the screen stops, and the screen displays the three-dimensional distribution of charge quantities and particle sizes and the charge quantity distribution and average charge quantity (coulombs/weight) and the like for each particle size. The triboelectric charge quantity of the toner can be measured by introducing the two-component developer as sample particles into the measurement part of the E-SPART ANALYZER.

Once the triboelectric charge quantity of the initial toner had been measured by this method, the two-component developer was left for one week in a thermohygrostat (temperature 30° C., humidity 80% RH), and the triboelectric charge quantity was measured again.

The measurement results were entered into the following formula to calculate the triboelectric charge quantity retention rate, which was evaluated by the following standard.

Formula: Toner triboelectric charge retention rate (%)=[triboelectric charge quantity of toner after 1 week]/[triboelectric charge quantity of initial toner]×100

(Evaluation Standard)

A: Toner triboelectric charge retention rate is 80% or more
B: Toner triboelectric charge retention rate is at least 60% and less than 80%
C: Toner triboelectric charge retention rate is less than 60%

TABLE 1

| | Toner No. | (1)* | Organic solvent or heating treatment | Crystalline resin (Crystalline polyester resin) | Amorphous resin (Polyester resin) | DCS Wt./ (Wr × Z/ 100) | Solid-state NMR | | Storability | Low-temperature fixability | Charging performance |
| | | | | | | | Standard deviation of HT1ρ-C | HT1ρ-C1/ HTρ-A1 | | | |
|---|---|---|---|---|---|---|---|---|---|---|---|
| Example 1 | 1 | (1)-A | Ethyl acetate | A | A | 0.21 | 3.6 | 4.3 | A | A | A |
| Example 2 | 2 | (1)-A | Ethyl acetate | A | B | 0.25 | 3.7 | 4.3 | A | A | A |
| Example 3 | 3 | (1)-B | Ethyl acetate | A | A | 0.21 | 3.3 | 3.2 | A | A | A |
| Example 4 | 4 | (1)-C | Ethyl acetate | A | A | 0.21 | 3.3 | 3.4 | A | A | A |
| Comparative Example 1 | 5 | (1)-A | — | A | A | 0.21 | 8.8 | 6.1 | C | A | C |
| Comparative Example 2 | 6 | (1)-A | Heating treatment | A | A | 0.21 | 9.4 | 7.9 | A | A | C |
| Comparative Example 3 | 7 | (1)-A | Ethyl acetate | A | C | 0.78 | 6.6 | 6.1 | A | E | A |
| Comparative Example 4 | 8 | (1)-D | — | A | B | 0.35 | 8.6 | 8.2 | A | D | A |
| Comparative Example 5 | 9 | (1)-B | — | A | A | 0.21 | 7.2 | 6.2 | C | A | C |
| Comparative Example 6 | 10 | (1)-C | — | A | A | 0.21 | 9.0 | 6.6 | C | A | C |

(1)* Toner manufacturing method
(1)-A: Emulsion aggregation method
(1)-B: Kneading pulverization method
(1)-C: Dissolution suspension method
(1)-D: Kneading pulverization method (kneaded at equal to or below melting point of crystalline resin)

TABLE 2

| | Toner No. | (1)* | Organic solvent or heating treatment | Crystalline resin (Crystalline polyester resin) | Amorphous resin (Polyester resin) | Solid-state NMR Standard deviation of HT1ρ-C of toner imparted heat history | (HT1ρ-C2) − (HTρ-A2) |
|---|---|---|---|---|---|---|---|
| Example 1 | 1 | (1)-A | Ethyl acetate | A | A | 8.8 | 7.6 |
| Example 2 | 2 | (1)-A | Ethyl acetate | A | B | 8.5 | 8.5 |
| Example 3 | 3 | (1)-B | Ethyl acetate | A | A | 8.8 | 7.6 |
| Example 4 | 4 | (1)-C | Ethyl acetate | A | A | 8.8 | 7.6 |
| Comparative Example 1 | 5 | (1)-A | — | A | A | 8.8 | 7.6 |
| Comparative Example 2 | 6 | (1)-A | Heating treatment | A | A | 8.8 | 7.6 |
| Comparative Example 3 | 7 | (1)-A | Ethyl acetate | A | C | 6.6 | 12.4 |
| Comparative Example 4 | 8 | (1)-D | — | A | B | 8.5 | 8.5 |
| Comparative Example 5 | 9 | (1)-B | — | A | A | 8.8 | 7.6 |
| Comparative Example 6 | 10 | (1)-C | — | A | A | 8.8 | 7.6 |

(1)* Toner manufacturing method
(1)-A: Emulsion aggregation method
(1)-B: Kneading pulverization method
(1)-C: Dissolution suspension method
(1)-D: Kneading pulverization method (kneaded at equal to or below melting point of crystalline resin)

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-249318, filed on Dec. 9, 2014, which is hereby incorporated by reference herein in its entirety.

The invention claimed is:

1. A toner comprising a crystalline resin and an amorphous resin,
wherein
a standard deviation of hydrogen nuclear relaxation times (HT1ρ-C) of the toner as measured by solid-state $^{13}$C-NMR is at least 0.0 and not more than 5.0, and
a hydrogen nuclear relaxation time (HT1ρ-C1) of a $^{13}$C peak with the longest relaxation time out of the hydrogen nuclear relaxation times (HT1ρ-C) and
a hydrogen nuclear relaxation time (HT1ρ-A1) of a $^{13}$C peak with the shortest relaxation time out of hydrogen nuclear relaxation times (HT1ρ-A)
satisfy the following Formula (1):

$$3.0 \leq \{(HT1\rho\text{-}C1)/(HT1\rho\text{-}A1)\} \leq 6.0 \quad \text{(Formula 1)}$$

the hydrogen nuclear relaxation times (HT1ρ-C) being obtained by solid-state $^{13}$C-NMR (CP/MAS) measurement of $^{13}$C peaks derived from the crystalline resin,
the $^{13}$C peaks derived from the crystalline resin being obtained by;
measuring the toner using solid-state $^{13}$C-NMR (DD/MAS),
arranging peak intensity of $^{13}$C peaks derived from the crystalline resin in descending order,
selecting $^{13}$C peaks starting with a $^{13}$C peak with the highest peak intensity and ending with a $^{13}$C peak at which the ratio of a cumulative value of the integral intensity of the $^{13}$C peak to a total value of the integral intensities of all $^{13}$C peaks reaches 90%,
while the hydrogen nuclear relaxation times (HT1ρ-A) being obtained by solid-state $^{13}$C-NMR (CP/MAS) measurement of all of $^{13}$C peaks derived from the amorphous resin,
the $^{13}$C peaks derived from the amorphous resin being obtained by measuring the toner using solid-state $^{13}$C-NMR (DD/MAS).

2. The toner according to claim 1,
wherein
the crystalline resin is a resin obtained by condensation polymerization of a dicarboxylic acid component containing at least one of compound selected from the group consisting of dicarboxylic acids represented by Structural Formula I below and derivatives thereof with a diol component containing at least one of compound selected from the group consisting of diols represented by Structural Formula II below and derivatives thereof, and
the amorphous resin is a resin obtained by condensation polymerization of a dicarboxylic acid component containing at least one of compound selected from the group consisting of isophthalic acid, terephthalic acid and derivatives of these with a diol component in which at least one of compound selected from the group consisting of aromatic diols represented by Structural Formula III below and derivatives thereof constitutes at least 50 mol % to the total of the diol component:

[Chem. 1]

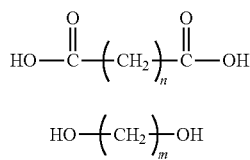

Structural Formula I

Structural Formula II (each of n and m in Structural Formulae I and II is an integer of at least 4 and not more than 12)

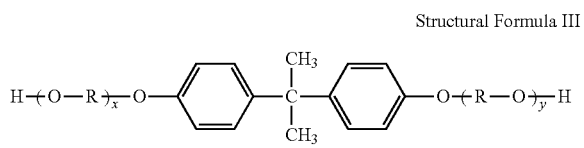

Structural Formula III (R in Structural Formula III is —$CH_2$—$CH(CH_3)$—, each of x and y is an integer of at least 1, and the average of x+y is at least 2 and not more than 10).

3. The toner according to claim 2,
wherein
a standard deviation of hydrogen nuclear relaxation times (HT1ρ-C) of a toner imparted with heat history as measured by solid-state $^{13}$C-NMR is at least 8.0 and not more than 12.0,
the toner imparted with heat history being obtained by heating and melting the toner at a temperature 50° C. higher than the glass transition temperature of the toner, and then cooling the toner to 25° C. at a rate of 20° C./minute, and
a hydrogen nuclear relaxation time (HT1ρ-C2) of a $^{13}$C peak with the shortest relaxation time out of the hydrogen nuclear relaxation times (HT1ρ-C) and
a hydrogen nuclear relaxation time (HT1ρ-A2) of a $^{13}$C peak with the longest relaxation time out of the hydrogen nuclear relaxation times (HT1ρ-A)
satisfy the following Formula (2):

−2.0 msec≤{($HT1ρ$-$C2$)−($HT1ρ$-$A2$)}≤10.0 msec    (Formula 2)

the hydrogen nuclear relaxation times (HT1ρ-C) being obtained by solid-state $^{13}$C-NMR (CP/MAS) measurement of $^{13}$C peaks derived from the crystalline resin,
the $^{13}$C peaks derived from the crystalline resin being obtained by;
measuring the toner imparted with heat history using solid-state $^{13}$C-NMR (DD/MAS),
arranging peak intensity of $^{13}$C peaks derived from the crystalline resin in descending order,
selecting $^{13}$C peaks starting with a $^{13}$C peak with the highest peak intensity and ending with a $^{13}$C peak at which the ratio of a cumulative value of the integral intensity of the $^{13}$C peak to a total value of the integral intensities of all $^{13}$C peaks reaches 90%,
while the hydrogen nuclear relaxation times (HT1ρ-A) being obtained by solid-state $^{13}$C-NMR (CP/MAS) measurement of all of $^{13}$C peaks derived from the amorphous resin,
the $^{13}$C peaks derived from the amorphous resin being obtained by measuring the toner imparted with heat history using solid-state $^{13}$C-NMR (DD/MAS).

4. The toner according to claim 3,
wherein
the toner contains at least 10 mass % and not more than 40 mass % of the crystalline resin.

5. The toner according to claim 3,
wherein
a melting point of the crystalline resin is at least 50° C. and not more than 100° C.

6. The toner according to claim 4,
wherein
a melting point of the crystalline resin is at least 50° C. and not more than 100° C.

7. The toner according to claim 2,
wherein
the toner contains at least 10 mass % and not more than 40 mass % of the crystalline resin.

8. The toner according to claim 7,
wherein
a melting point of the crystalline resin is at least 50° C. and not more than 100° C.

9. The toner according to claim 2,
wherein
a melting point of the crystalline resin is at least 50° C. and not more than 100° C.

10. The toner according to claim 1,
wherein
a standard deviation of hydrogen nuclear relaxation times (HT1ρ-C) of a toner imparted with heat history as measured by solid-state $^{13}$C-NMR is at least 8.0 and not more than 12.0,
the toner imparted with heat history being obtained by heating and melting the toner at a temperature 50° C. higher than the glass transition temperature of the toner, and then cooling the toner to 25° C. at a rate of 20° C./minute, and
a hydrogen nuclear relaxation time (HT1ρ-C2) of a $^{13}$C peak with the shortest relaxation time out of the hydrogen nuclear relaxation times (HT1ρ-C) and
a hydrogen nuclear relaxation time (HT1ρ-A2) of a $^{13}$C peak with the longest relaxation time out of the hydrogen nuclear relaxation times (HT1ρ-A)
satisfy the following Formula (2):

−2.0 msec≤{($HT1ρ$-$C2$)−($HT1ρ$-$A2$)}≤10.0 msec    (Formula 2)

the hydrogen nuclear relaxation times (HT1ρ-C) being obtained by solid-state $^{13}$C-NMR (CP/MAS) measurement of $^{13}$C peaks derived from the crystalline resin,
the $^{13}$C peaks derived from the crystalline resin being obtained by;
measuring the toner imparted with heat history using solid-state 13C-NMR (DD/MAS),
arranging peak intensity of $^{13}$C peaks derived from the crystalline resin in descending order,
selecting $^{13}$C peaks starting with a $^{13}$C peak with the highest peak intensity and ending with a $^{13}$C peak at which the ratio of a cumulative value of the integral intensity of the $^{13}$C peak to a total value of the integral intensities of all $^{13}$C peaks reaches 90%,
while the hydrogen nuclear relaxation times (HT1ρ-A) being obtained by solid-state $^{13}$C-NMR (CP/MAS) measurement of all of $^{13}$C peaks derived from the amorphous resin,
the $^{13}$C peaks derived from the amorphous resin being obtained by measuring the toner imparted with heat history using solid-state $^{13}$C-NMR (DD/MAS).

11. The toner according to claim 10,
wherein
the toner contains at least 10 mass % and not more than 40 mass % of the crystalline resin.

12. The toner according to claim 11,
wherein
a melting point of the crystalline resin is at least 50° C. and not more than 100° C.

13. The toner according to claim 10,
wherein
a melting point of the crystalline resin is at least 50° C. and not more than 100° C.

14. The toner according to claim 1,
wherein
the toner contains at least 10 mass % and not more than 40 mass % of the crystalline resin.

15. The toner according to claim 14,
wherein
a melting point of the crystalline resin is at least 50° C. and not more than 100° C.

16. The toner according to claim 1,
wherein
a melting point of the crystalline resin is at least 50° C. and not more than 100° C.

17. The toner according to claim 1,
wherein
the toner is manufactured by a manufacturing method comprising;
a compatibilization step of compatibilizing the crystalline resin and the amorphous resin to obtain a compatibilized blend, and
a solvent treatment step of treating the compatibilized blend with a good solvent for the amorphous resin and a poor solvent for the crystalline resin.

18. The toner according to claim 17,
wherein
the compatibilization step is
a step of heating the crystalline resin and the amorphous resin to equal to or above a melting point of the crystalline resin to compatibilize the crystalline resin and the amorphous resin and obtain a compatibilized blend, or
a step of dissolving the crystalline resin and the amorphous resin in an organic solvent capable of dissolving the crystalline resin and the amorphous resin to compatibilize the crystalline resin and the amorphous resin and obtain a compatibilized blend.

19. The toner according to claim 17,
wherein
the good solvent for the amorphous resin is a solvent in which the amorphous resin has a solubility of at least 100 g/L at the treatment temperature used in the solvent treatment step, and
the poor solvent for the crystalline resin is a solvent in which the crystalline resin has a solubility of less than 10 g/L at the treatment temperature used in the solvent treatment step.

20. The toner according to claim 17,
wherein
the toner satisfies the following (Formula 3):

$$0.00 \leq \{Wt/(Wr \times Z/100)\} \leq 0.50 \quad \text{(Formula 3)}$$

Wt: An amount of heat of fusion (J/g) derived from the crystalline resin during second temperature rise in measurement of the toner by differential scanning calorimeter (DSC)
Wr: An amount of heat of fusion (J/g) during second temperature rise in measurement of the crystalline resin by differential scanning calorimeter (DSC)
Z: A content ratio (mass %) of the crystalline resin in the toner.

* * * * *